(12) United States Patent
Song

(10) Patent No.: US 12,424,249 B2
(45) Date of Patent: Sep. 23, 2025

(54) BUFFER CHIP, AND SEMICONDUCTOR PACKAGE INCLUDING THE BUFFER CHIP AND A MEMORY CHIP

(71) Applicant: SK hynix Inc., Icheon-si (KR)

(72) Inventor: Choung Ki Song, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 161 days.

(21) Appl. No.: 18/509,039

(22) Filed: Nov. 14, 2023

(65) Prior Publication Data

US 2024/0249753 A1 Jul. 25, 2024

(30) Foreign Application Priority Data

Jan. 19, 2023 (KR) .................. 10-2023-0008384
Jan. 19, 2023 (KR) .................. 10-2023-0008385
Feb. 23, 2023 (KR) .................. 10-2023-0024041
Mar. 14, 2023 (KR) .................. 10-2023-0032912
Jul. 14, 2023 (KR) .................. 10-2023-0091461

(51) Int. Cl.
*G11C 7/10* (2006.01)
*G11C 7/22* (2006.01)
(Continued)

(52) U.S. Cl.
CPC .......... *G11C 7/1039* (2013.01); *G11C 7/1063* (2013.01); *G11C 7/222* (2013.01); *H01L 24/08* (2013.01); *H01L 24/48* (2013.01); *H01L 25/0657* (2013.01); *H01L 2224/08111* (2013.01); *H01L 2224/08145* (2013.01); *H01L 2224/48132* (2013.01);
(Continued)

(58) Field of Classification Search
CPC ..... G11C 7/1039; G11C 7/1063; G11C 7/222; G11C 2207/2272; G11C 7/109; G11C 8/06; G11C 5/04; H01L 24/08; H01L 24/48; H01L 25/0657; H01L 2224/08111; H01L 2224/08145; H01L 2224/48132; H01L 2224/48147; H01L 2225/06506; H01L 2225/0651; H01L 2924/1431; H01L 2924/1434; H01L 2924/15311; H10B 80/00
USPC ..................................... 365/189.05
See application file for complete search history.

(56) References Cited

U.S. PATENT DOCUMENTS

2007/0201256 A1* 8/2007 RaghuRam ............. G11C 5/04
  365/198
2017/0212848 A1* 7/2017 Sun ......................... G11C 5/04
2019/0171359 A1* 6/2019 Lee ........................ G06F 12/02

FOREIGN PATENT DOCUMENTS

DE 102007009817 B4 * 8/2012 ............ G11C 5/04

* cited by examiner

*Primary Examiner* — Fernando Hidalgo
(74) *Attorney, Agent, or Firm* — WILLIAM PARK AND ASSOCIATES LTD.

(57) ABSTRACT

A buffer chip includes: a chip select signal reception circuit configured to receive chip select signals transmitted from a memory controller; a command address reception circuit configured to receive command address signals transmitted from the memory controller; a chip select signal transmission circuit configured to transmit the chip select signals to a plurality of memory chips; a command address transmission circuit configured to transmit the command address signals to the plurality of memory chips; and a command address fixing circuit configured to fix levels of at least one of the command address signals transmitted by the command address transmission circuit when the chip select signals are deactivated for a predetermined time or more.

13 Claims, 21 Drawing Sheets

(51) Int. Cl.
 *H01L 23/00* (2006.01)
 *H01L 25/065* (2023.01)
 *H10B 80/00* (2023.01)
(52) U.S. Cl.
 CPC ............... *H01L 2224/48147* (2013.01); *H01L 2225/06506* (2013.01); *H01L 2225/0651* (2013.01); *H01L 2924/1431* (2013.01); *H01L 2924/1434* (2013.01); *H01L 2924/15311* (2013.01); *H10B 80/00* (2023.02)

FIG. 11

|  | CA ODT=VDD | CA ODT=VSS |
|---|---|---|
| RTT of M_CLK_t, M_CLK_c | 40Ω | OFF |
| RTT of M_CS<0:3> | 40Ω | OFF |
| RTT of M_CA<0:13> | 80Ω | OFF |

BUFFER CHIP, AND SEMICONDUCTOR PACKAGE INCLUDING THE BUFFER CHIP AND A MEMORY CHIP

CROSS-REFERENCE TO RELATED APPLICATION

This application claims priority under 35 U.S.C. § 119(a) to Korean Patent Application No. 10-2023-0008384 filed on Jan. 19, 2023, Korean Patent Application No. 10-2023-0008385 filed on Jan. 19, 2023, Korean Patent Application No. 10-2023-0024041 filed on Feb. 23, 2023, Korean Patent Application No. 10-2023-0032912 filed on Mar. 14, 2023, and Korean Patent Application No. 10-2023-0091461 filed on Jul. 14, 2023, which are incorporated herein by reference in its entirety.

BACKGROUND

1. Technical Field

Embodiments of the present disclosure generally relate to a semiconductor package, and more particularly, a semiconductor package including a buffer chip and a memory chip, and a memory module including the buffer chip and the memory chip.

2. Related Art

Recently, as application fields utilizing artificial intelligence and big data increase, the amount of data to be processed is explosively increasing. Many computer systems (for example, data centers, servers, and the like) require a large amount of memory, and applications using the computer systems require a larger amount of memory than system capabilities. However, it is becoming increasingly difficult to add a memory to the computer system due to issues such as latency and bandwidths. Various methods for increasing the amount of a memory in a system while maintaining low latency and a high bandwidth are being studied.

SUMMARY

In an embodiment, a buffer chip may include: a chip select signal reception circuit configured to receive chip select signals transmitted from a memory controller; a command address reception circuit configured to receive command address signals transmitted from the memory controller; a chip select signal transmission circuit configured to transmit the chip select signals to a plurality of memory chips; a command address transmission circuit configured to transmit the command address signals to the plurality of memory chips; and a command address fixing circuit configured to fix levels of at least one of the command address signals transmitted by the command address transmission circuit when the chip select signals are deactivated for a predetermined time or more.

In an embodiment, a semiconductor package may include: a package substrate including a plurality of terminals configured to communicate with a memory controller and a plurality of bonding pads configured to communicate inside a package; a buffer chip stacked on the package substrate; a plurality of memory chips stacked on the buffer chip; and a plurality of wires connecting the plurality of bonding pads and the plurality of memory chips, wherein the buffer chip is configured to communicate with the memory controller through the plurality of terminals of the package substrate, and the plurality of memory chips are configured to communicate with the buffer chip through the plurality of wires and the plurality of bonding pads of the package substrate. The buffer chip may include: a chip select signal reception circuit configured to receive chip select signals transmitted from the memory controller; a command address reception circuit configured to receive command address signals transmitted from the memory controller; a chip select signal transmission circuit configured to transmit the chip select signals to the plurality of memory chips; a command address transmission circuit configured to transmit the command address signals to the plurality of memory chips; and a command address fixing circuit configured to fix levels of at least one of the command address signals transmitted by the command address transmission circuit when the chip select signals are deactivated for a predetermined period of time or more.

In an embodiment, a semiconductor package may include: a buffer chip configured to communicate with a memory controller; and a plurality of memory chips configured to communicate with the memory controller through the buffer chip, wherein a logic high-level voltage may be connected to initial termination setting pads configured to set initial termination resistance values of at least one of the plurality of memory chips, and a logic low-level voltage may be connected to the initial termination setting pads of a rest of the plurality of memory chips.

In an embodiment, a semiconductor package may include: a buffer chip configured to communicate with a memory controller; and a plurality of memory chips configured to communicate with the memory controller through the buffer chip, wherein the buffer chip may include: an initial termination control circuit configured to generate initial termination resistance value signals configured to set an initial termination resistance value of each of the plurality of memory chips; and an initial resistance value signal transmission circuit configured to transmit the initial termination resistance value signals generated by the initial termination control circuit to the plurality of memory chips, wherein each of the memory chips may include an initial termination setting pad configured to set an initial termination resistance value, and configured to receive a signal corresponding to each of the memory chips among the initial termination resistance value signals through the initial termination setting pad.

In an embodiment, a buffer chip may include: a chip select signal reception circuit configured to receive chip select signals from a memory controller; a command address reception circuit configured to receive command address signals from the memory controller; a clock reception circuit configured to receive a clock from the memory controller; a control signal transmission circuit configured to buffer the chip select signals and the command address signals in synchronization with the clock; a command address transmission circuit configured to transmit the command address signals transmitted from the control signal transmission circuit to a plurality of memory chips; a chip select signal transmission circuit; and a chip select signal bypass control circuit configured to control the chip select signal transmission circuit to transmit chip select signals received by the chip select signal reception circuit and having bypassed the control signal transmission circuit to the plurality of memory chips in an asynchronous mode, and controls the chip select signal transmission circuit to transmit chip select signals transmitted from the control signal transmission circuit to the plurality of memory chips in a synchronous mode.

In an embodiment, a semiconductor package may include: a package substrate including a plurality of terminals configured to communicate with a memory controller and a plurality of bonding pads configured to communicate inside a package; a buffer chip stacked on the package substrate; a plurality of memory chips stacked on the buffer chip; and a plurality of wires connecting the plurality of bonding pads and the plurality of memory chips, wherein the buffer chip is configured to communicate with the memory controller through the plurality of terminals of the package substrate, the plurality of memory chips are configured to communicate with the buffer chip through the plurality of wires and the plurality of bonding pads of the package substrate. The buffer chip may include: a chip select signal reception circuit configured to receive chip select signals from the memory controller; a command address reception circuit configured to receive command address signals from the memory controller; a clock reception circuit configured to receive a clock from the memory controller; a control signal transmission circuit configured to buffer the chip select signals and the command address signals in synchronization with the clock; a command address transmission circuit configured to transmit the command address signals transmitted from the control signal transmission circuit to the plurality of memory chips; a chip select signal transmission circuit; and a chip select signal bypass control circuit configured to control the chip select signal transmission circuit to transmit chip select signals received by the chip select signal reception circuit and having bypassed the control signal transmission circuit to the plurality of memory chips in an asynchronous mode, and controls the chip select signal transmission circuit to transmit chip select signals transmitted from the control signal transmission circuit to the plurality of memory chips in a synchronous mode.

In an embodiment, a buffer chip may include: an external control signal interface configured to receive control signals transmitted from the memory controller; a clock reception circuit configured to receive a clock from the memory controller; a control signal transmission circuit configured to buffer the control signals in synchronization with the clock; a bypass control circuit configured to select control signals received through the external control signal interface and having bypassed the control signal transmission circuit in a bypass mode, and selects control signals transferred from the control signal transmission circuit in a normal mode; and an internal control signal interface configured to transmit control signals selected by the bypass control circuit to a plurality of memory chips.

In an embodiment, a semiconductor package may include: a package substrate including a plurality of terminals configured to communicate with a memory controller and a plurality of bonding pads configured to communicate inside a package; a buffer chip stacked on the package substrate; a plurality of memory chips stacked on the buffer chip; and a plurality of wires connecting the plurality of bonding pads and the plurality of memory chips, wherein the buffer chip is configured to communicate with the memory controller through the plurality of terminals of the package substrate, the plurality of memory chips are configured to communicate with the buffer chip through the plurality of wires and the plurality of bonding pads of the package substrate. The buffer chip may include: an external control signal interface configured to receive control signals transmitted from the memory controller; a clock reception circuit configured to receive a clock from the memory controller; a control signal transmission circuit configured to buffer the control signals in synchronization with the clock; a bypass control circuit configured to select control signals received through the external control signal interface and bypassed the control signal transmission circuit in a bypass mode, and selects control signals transferred from the control signal transmission circuit in a normal mode; and an internal control signal interface configured to transmit control signals selected by the bypass control circuit to the plurality of memory chips.

In an embodiment, a buffer chip may include: a chip select signal reception circuit configured to receive chip select signals transmitted from a memory controller; a command address reception circuit configured to receive command address signals transmitted from the memory controller; a chip select signal transmission circuit configured to transmit the chip select signals to a plurality of memory chips; a command address transmission circuit configured to transmit the command address signals to the plurality of memory chips; and a command address fixing circuit configured to fix levels of at least one of the command address signals transmitted by the command address transmission circuit in response the chip select signals.

BRIEF DESCRIPTION OF THE DRAWINGS

FIG. 11 is a table illustrating an example of initial values of termination resistors according to voltage levels of termination setting pads.

DETAILED DESCRIPTION

Various embodiments are directed to reducing loading due to an increase in a memory while increasing the capacity of a memory.

Various embodiments of the present disclosure can reduce loading due to an increase in memory while increasing the capacity of a memory.

Hereafter, embodiments in accordance with the technical spirit of the present disclosure will be described with reference to the accompanying drawings. The word "predetermined" as used herein with respect to a parameter, such as a predetermined time or predetermined stage, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Figure 1:
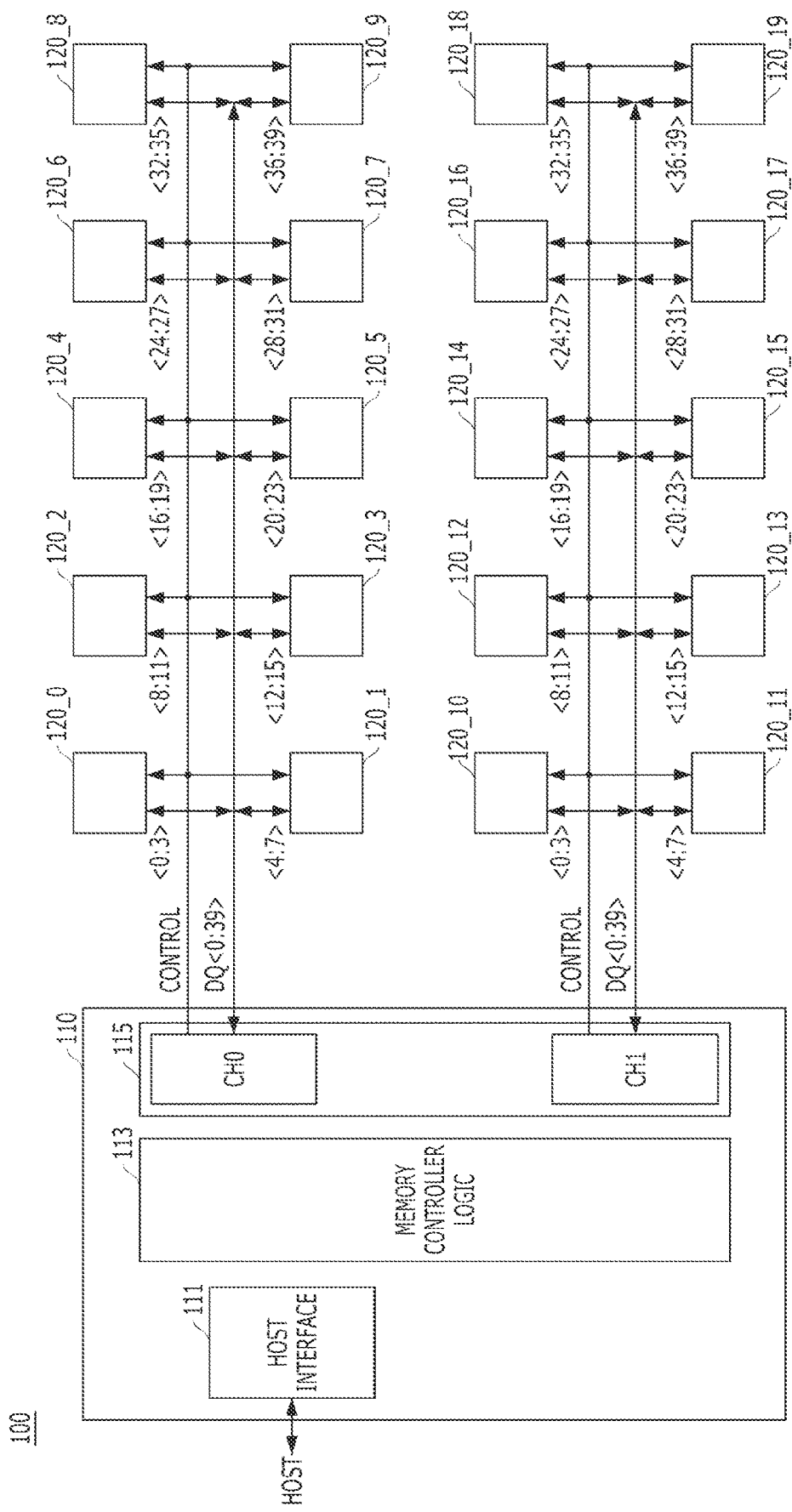
FIG. 1 is a configuration diagram of a memory module in accordance with an embodiment.

FIG. 1 is a configuration diagram of a memory module 100 in accordance with an embodiment.

Referring to FIG. 1, the memory module 100 may include a module controller 110 and memory packages 120_0 to 120_19.

The module controller 110 may include a host interface 111, a memory controller logic 113, and a memory interface 115. The memory controller logic 113 and the memory interface 115 are also referred to as a memory controller.

The host interface 111 may be used for communication between the module controller 110 and a host HOST (computer system). The host interface 111 may be a compute express link (CXL) interface. The CXL interface is an interface based on peripheral component interconnect express (PCIe), and may be an interface made so that a central processing unit (CPU), a graphic processing unit (GPU), and various types of accelerators more efficiently use a memory and the like. By connecting the memory module 100 to the host HOST through the CXL interface, the memory capacity of a computer system such as a data center and a server can be increased, and various processors in the computer system can share the memory.

The memory controller logic 113 may be a logic for controlling the memory packages 120_0 to 120_19, and the memory interface 115 may be an interface for communication with the memory packages 120_0 to 120_19. The memory interface 115 may include two channels CH0 and CH1. Ten memory packages 120_0 to 120_9 may be connected to the channel CH0 of the memory interface 115, and ten memory packages 120_10 to 120_19 may be connected to the channel CH1.

The channel CH0 of the memory interface 115 may be connected to the memory packages 120_0 to 120_9 through 40 data lines DQ<0:39>. Four different data lines may be connected to the memory packages 120_0 to 120_9. For example, four data lines DQ<0:3> may be connected to the memory package 120_0, and four data lines DQ<4:7> may be connected to the memory package 120_1.

The channel CH0 of the memory interface 115 may be connected to the memory packages 120_0 to 120_9 through control signal transmission lines CONTROL. The control signal transmission lines CONTROL may include a plurality of lines, and may be common to the memory packages 120_0 to 120_9. For example, all of the control signal transmission lines CONTROL may be connected to the memory package 120_0 and may also be connected to the memory package 120_1. Although not illustrated in the drawing, lines for transmitting clocks and data strobe signals may be further connected between the channel CH0 of the memory interface 115 and the memory packages 120_0 to 120_9.

The channel CH1 of the memory interface 115 and the memory packages 120_10 to 120_19 may be connected in the same way as the channel CH0 and the memory packages 120_0 to 120_9.

Each of the memory packages 120_0 to 120_19 may include one or more memory chips (for example, DRAM chips). In an embodiment, because one of the important reasons for using the memory module 100 is to greatly increase the capacity of a memory, it is general that each of the memory packages 120_0 to 120_19 includes a plurality of memory chips. As one of methods of putting a plurality of memory chips into a memory package, a method such as 3 dimensional stacking (3DS) has been used. The 3DS method may use a through-silicon via (TSV) for communication between memory chips in a memory package. However, when a memory package is manufactured in this way, in an embodiment, the price of the memory package may increase because a lot of time and cost are required in packaging.

In the memory module 100 in accordance with an embodiment of the present disclosure, each of the memory packages 120_0 to 120_19 may include a buffer chip and a plurality of memory chips. The buffer chip may perform a buffer operation between the module controller 110 and the plurality of memory chips. The plurality of memory chips included in each of the memory packages 120_0 to 120_19 may be connected to the buffer chip through wire bonding. In an embodiment, the memory module 100 may increase a memory capacity by using the plurality of memory chips and reduce loading due to an increase in memory by using a buffer chip.

However, the configuration of the memory packages 120_0 to 120_19 disclosed in the present specification is merely an example and might not be limited thereto. For example, each of the memory packages 120_0 to 120_19 may include different types of memory chips. For example, at least one of the memory packages 120_0 to 120_19 may have a different configuration from other memory packages and/or may be connected to the module controller 110 in a different way. For example, memory chips included in at least one of the memory packages 120_0 to 120_19 may be integrated using a 3 dimensional stacking (3DS) method, a monolithic 3D (M3D) method, or the like. For example, memory chips included in at least one of the memory packages 120_0 to 120_19 may communicate with each other by using through-silicon vias (TSVs) or vias with a smaller size and higher density than the TSVs.

In an embodiment, the form factor of the memory module 100 may have various forms such as an add-in-card (AIC) and an enterprise and data center SSD form factor (EDSFF).

Figure 2:
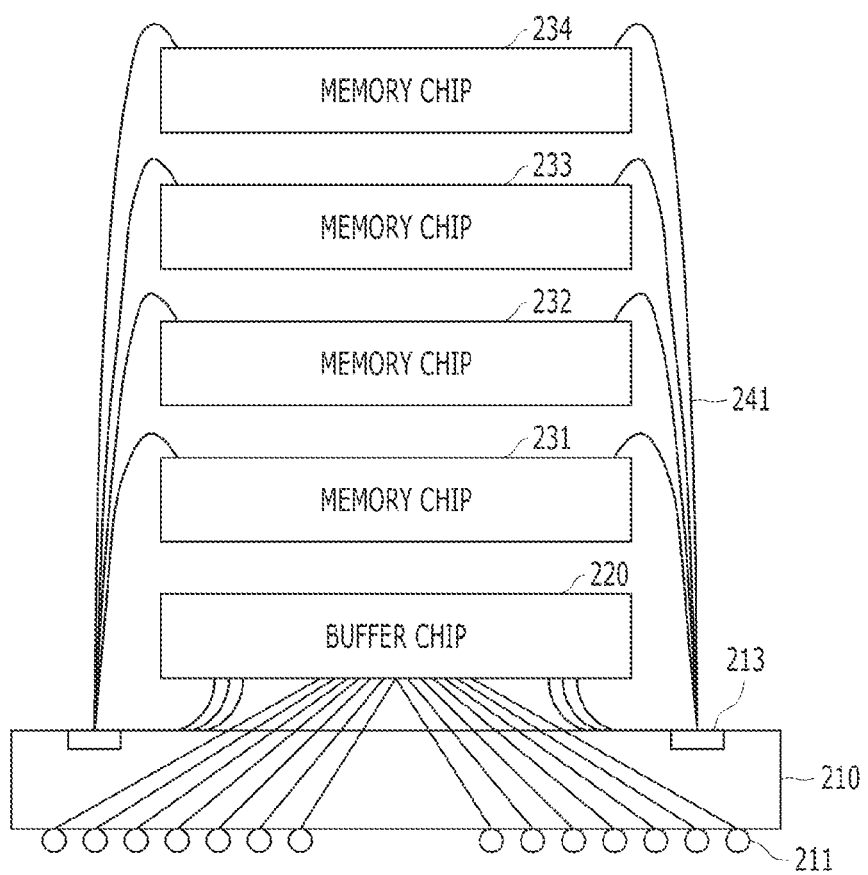
FIG. 2 is a configuration diagram of an embodiment of a memory package in FIG. 1.

FIG. 2 is a configuration diagram of an embodiment of the memory package 120 in FIG. 1.

Referring to FIG. 2, the memory package 120 may include a package substrate 210, a buffer chip 220, and a plurality of memory chips 231 to 234.

The package substrate 210 may include a plurality of package balls 211 that are terminals for communication with the memory interface 115 (FIG. 1) and a plurality of bonding pads 213 for communication inside the memory package 120.

The buffer chip 220 may be disposed on the package substrate 210. The buffer chip 220 may communicate with the memory interface 115 (FIG. 1) through the package balls 211 of the package substrate 210. The buffer chip 220 may further communicate with the memory chips 231 to 234 through the bonding pads 213 of the package substrate 210.

The memory chips 231 to 234 may be stacked on the buffer chip 220, and may communicate with the buffer chip 220 through wires 241 connecting the bonding pads 213 and the memory chips 231 to 234. The memory chips 231 to 234 may communicate with the memory interface 115 (FIG. 1) through the buffer chip 220. The control signals CONTROL (FIG. 1) and the data DQ<0:39> (FIG. 1) transmitted from the memory interface 115 (FIG. 1) may be transmitted to the buffer chip 220 through the package balls 211, buffered, and then transmitted from the buffer chip 220 to the memory chips 231 to 234 through the bonding pads 213. Data transmitted from the memory chips 231 to 234 may be transmitted to the buffer chip 220 through the bonding pads 213, buffered, and then transmitted to the memory interface 115 (FIG. 1) through the package balls 211.

In an embodiment, because only the buffer chip 220 among the chips of the memory package 120 may be connected to the memory interface 115 (FIG. 1), loading between the memory package 120 and the memory interface 115 (FIG. 1) may be reduced to enable a high-speed operation. In an embodiment, because the buffer chip 220 and the memory chips 231 to 234 are connected through wiring instead of a TSV that consumes a lot of cost in a manufacturing process, the manufacturing cost of the memory package 120 may be reduced.

Figure 3:
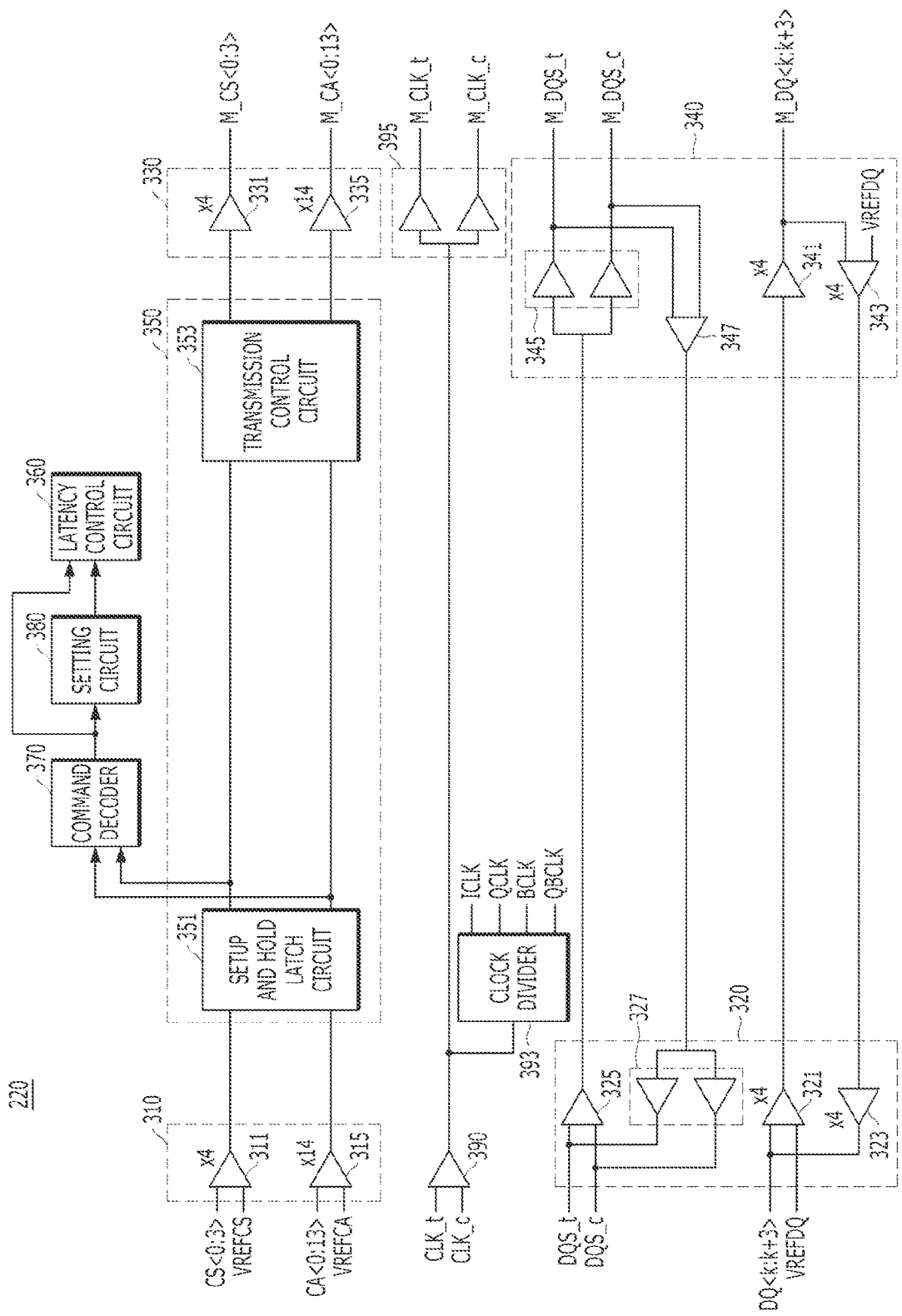
FIG. 3 is a configuration diagram of an embodiment of a buffer chip in FIG. 2.

FIG. 3 is a configuration diagram of an embodiment of the buffer chip 220 in FIG. 2.

Referring to FIG. 3, the buffer chip 220 may include an external control signal interface 310, an external data interface 320, an internal control signal interface 330, an internal data interface 340, a control signal transmission circuit 350, a latency control circuit 360, a command decoder 370, a setting circuit 380, a clock reception circuit 390, a clock divider 393, and a clock transmission circuit 395.

The external control signal interface 310 may receive the control signals CONTROL (FIG. 1) transmitted from the memory interface 115 (FIG. 1). The control signals CONTROL (FIG. 1) may include chip select signals CS<0:3> and command address signals CA<0:13>. The external control signal interface 310 may include a chip select signal reception circuit 311 and a command address reception circuit 315.

The chip select signals CS<0:3> are used for distinguishing the memory chips 231 to 234 (FIG. 2) in the memory package 120 (FIG. 2), that is, for distinguishing ranks, and the number of chip select signals CS<0:3> may be the same as the number of the memory chips 231 to 234 (FIG. 2) in the memory package 120 (FIG. 2). In FIG. 3, because the number of chip select signals CS<0:3> is illustrated as 4, the chip select signal reception circuit 311 may include four reception buffers. Buffers of the chip select signal reception circuit 311 may receive the chip select signals CS<0:3> by comparing voltage levels of the chip selection reference voltage VREFCS and the chip select signals CS<0:3> with each other.

The command address reception circuit 315 may include the same number of reception buffers as the number of command address signals CA<0:13>. In FIG. 3, because the number of command address signals CA<0:13> is illustrated as 14, the command address reception circuit 315 may include 14 reception buffers. Buffers of the command address reception circuit 315 may receive the command address signals CA<0:13> by comparing voltage levels of a command address reference voltage VREFCA and the command address signals CA<0:13> with each other.

The external data interface 320 may transmit/receive data DQ<k:k+3> (K is an integer equal to or greater than 0) to/from the memory interface 115 (FIG. 1). The external data interface 320 may transmit/receive not only the data DQ<k:k+3> but also data strobe signals DQS_t and DQS_c for strobing the data DQ<k:k+3>. The external data interface 320 may include an external data reception circuit 321, an external data transmission circuit 323, an external data strobe reception circuit 325, and an external data strobe transmission circuit 327.

The external data reception circuit 321 may include the same number of reception buffers as the number of terminals to which the data DQ<k:k+3> are input. In FIG. 3, because FIG. 3 four data terminals are provided for each memory package 120 (FIG. 2), the external data reception circuit 321 may include four reception buffers (i.e., ×4). Buffers of the external data reception circuit 321 may receive the data DQ<k:k+3> by comparing voltage levels of the data reference voltage VREFDQ and the data DQ<k:k+3> with each other.

The external data strobe reception circuit 325 may receive the data strobe signals DQS_t and DQS_c transmitted from the memory interface 115 (FIG. 1), together with the data DQ<k:k+3>. Because the data strobe signals DQS_t and DQS_c are differential-type signals, the external data strobe reception circuit 325 may include a reception buffer that compares voltage levels of a positive data strobe signal DQS_t and a negative data strobe signal DQS_c with each other and receives them.

The external data transmission circuit 323 may transmit the data DQ<k:k+3>. The external data transmission circuit 323 may include four transmission drivers.

The external data strobe transmission circuit 327 may transmit the data strobe signals DQS_t and DQS_c for strobing the data DQ<k:k+3> transmitted by the external data transmission circuit 323. The external data strobe transmission circuit 327 may include two transmission drivers.

The clock reception circuit 390 may receive clocks CLK_t and CLK_c transmitted from the memory interface 115 (FIG. 1). Because the clocks CLK_t and CLK_c are differential-type signals, the clock reception circuit 390 may include a reception buffer that compares voltage levels of the regular clock CLK_t and the secondary clock CLK_c and receives them.

The clock divider 393 may divide the clocks CLK_t and CLK_c received by the clock reception circuit 390. First to fourth clocks ICLK, QCLK, BCLK, and QBCLK generated by the clock divider 393 may each have a frequency of half the frequency of each of the clocks CLK_t and CLK_c, and may have different phases. The clocks CLK_t and CLK_c received by the clock reception circuit 390 and the first to fourth clocks ICLK, QCLK, BCLK, and QBCLK generated by the clock divider 393 may be used by various components inside the buffer chip 220.

The control signal transmission circuit 350 may buffer the control signals received through the external control signal interface 310, and transmit the buffered control signals to the internal control signal interface 330. The control signal transmission circuit 350 may include a setup and hold latch circuit 351 for securing a setup hold margin and a transmission control circuit 353 performing a buffering operation.

The internal control signal interface 330 may transmit control signals M_CS<0:3> and M_CA<0:13> transmitted through the control signal transmission circuit 350 to the memory chips 231 to 234 (FIG. 2). The command address signals M_CA<0:13> may be transmitted in common to the memory chips 231 to 234 (FIG. 2), and the chip select signals M_CS<0:3> may be transmitted to the memory chips 231 to 234 (FIG. 2) in a one-to-one manner. That is, the chip select signal M_CS<0> may be transmitted to the memory chip 231 (FIG. 2), the chip select signal M_CS<1> may be transmitted to the memory chip 232 (FIG. 2), the chip select signal M_CS<2> may be transmitted to the memory chip 233 (FIG. 2), and the chip select signal M_CS<3> may be transmitted to the memory chip 234 (FIG. 2).

The internal control signal interface 330 may include a chip select signal transmission circuit 331 and a command address transmission circuit 335. Because the number of chip select signals M_CS<0:3> is 4, the chip select signal transmission circuit 331 may include four transmission drivers. Also, because the number of command address signals M_CA<0:13> is 14, the command address transmission circuit 335 may include 14 transmission drivers.

The internal data interface 340 may transmit/receive data M_DQ<k:k+3> to/from the memory chips 231 to 234 (FIG. 2). The data M_DQ<k:k+3> may be connected in common to the memory chips 231 to 234 (FIG. 2). When the data M_DQ<k:k+3> is transmitted in common to the memory chips 231 to 234 (FIG. 2) during a write operation, a memory chip selected to perform a write operation among the memory chips 231 to 234 (FIG. 2) may receive the data M_DQ<k:k+3> transmitted by the internal data interface 340. During a read operation, a memory chip selected to perform a read operation among the memory chips 231 to 234 may transmit the data M_DQ<k:k+3> to the internal data interface 340. The internal data interface 340 may transmit/receive not only the data M_DQ<k:k+3> but also the data strobe signals M_DQS_t and M_DQS_c for strobing the data M_DQ<k:k+3> to/from the memory chips 231 to 234 (FIG. 2).

The internal data interface 340 may include an internal data transmission circuit 341, an internal data reception circuit 343, an internal data strobe transmission circuit 345, and an internal data strobe reception circuit 347. The internal data transmission circuit 341 may include four transmission drivers, and the internal data reception circuit 343 may include four reception buffers. The internal data strobe transmission circuit 345 may include two transmission drivers, and the internal data strobe receive circuit 347 may include one reception buffer.

The clock transmission circuit 395 may transmit the clocks M_CLK_t and M_CLK_c to the memory chips 231 to 234 (FIG. 2). The clocks M_CLK_t and M_CLK_c may be transmitted in common to the memory chips 231 to 234 (FIG. 2). The clock transmission circuit 395 may include two transmission drivers.

The command decoder 370 may decode the chip select signals CS<0:3> and the command address signals CA<0:13> received through the external control signal interface 310. The command decoder 370 may receive and decode control signals latched by the setup and hold latch circuit 351 after being received by the external control signal interface 310. The chip select signals CS<0:3> indicate the validity of the command address signals CA<0:13>, and when even one of the four chip select signals CS<0:3> is activated to a low level, the command decoder 370 of the buffer chip 220 may determine that the command address signals CA<0:13> are valid and decode the command address signals CA<0:13>.

The setting circuit 380 may perform a setting operation according to the decoding result of the command decoder 370. Setting items of the setting circuit 380 may include a read latency of the buffer chip 220, a write latency of the buffer chip 220, levels of reference voltages used by the buffer chip 220, a termination resistance value (also referred to as Rtt) of the buffers of the buffer chip 220, a termination resistance value (also referred to as Ron) of the drivers of the buffer chip 220, an equalizing coefficient (for example, a coefficient of decision feedback equalization) of the buffer chip 220, a command rate, and the like.

The latency control circuit 360 may control whether to activate the external data interface 320 and the internal data interface 340. The latency control circuit 360 may activate the external data reception circuit 321 and the internal data transmission circuit 341 so that the data DQ<k:k+3> transmitted from the memory interface 115 (FIG. 1) to the buffer chip 220 may be received after a write latency set by the setting circuit 380 from the time point when a write command is applied to the buffer chip 220 and transmitted to the memory chips 231 to 234 (FIG. 2). The latency control circuit 360 may further activate the internal data reception circuit 343 and the external data transmission circuit 323 so that data DQ<k:k+3> buffered after being received from the memory chips 231 to 234 (FIG. 2) may be transmitted from the buffer chip 220 to the memory interface 115 (FIG. 1) after a read latency set by the setting circuit 380 from the time point when a read command is applied to the buffer chip 220. The latency control circuit 360 may activate the external data strobe reception circuit 325 and the internal data strobe transmission circuit 345 during the write operation and activate the internal data strobe reception circuit 347 and the external data strobe transmission circuit 327 during the read operation so that the data strobe signals DQS_t and DQS_c may also be transmitted and received together with the data DQ<k:k+3>. The latency control circuit 360 may receive information indicating that the read command and the write command have been applied to the buffer chip 220 from the command decoder 370, and receive information related to the read latency and the write latency from the setting circuit 380.

Figure 4:
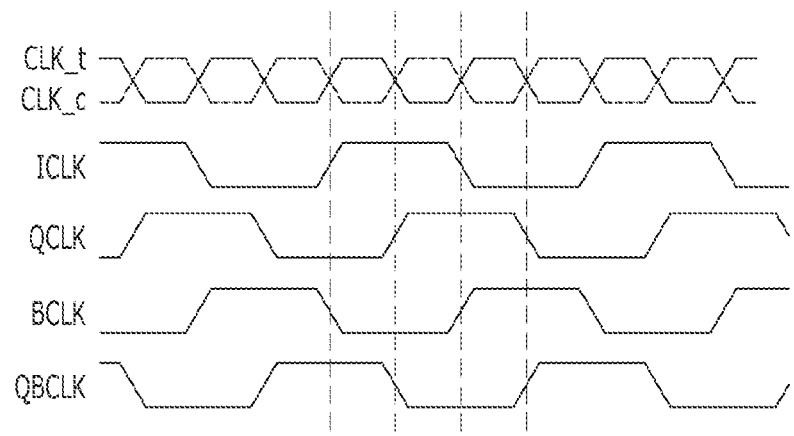
FIG. 4 is a diagram illustrating an example of first to fourth clocks generated by a clock divider in FIG. 3.

FIG. 4 is a diagram illustrating an example of the first to fourth clocks ICLK, QCLK, BCLK, and QBCLK generated by the clock divider 393 in FIG. 3.

Referring to FIG. 4, the first to fourth clocks ICLK, QCLK, BCLK, and QBCLK generated by the clock divider 393 may each have a frequency of half the frequency of each of the clocks CLK_t and CLK_c, and may have a phase difference of 90° among the first to fourth clocks ICLK, QCLK, BCLK, and QBCLK.

Figure 5:
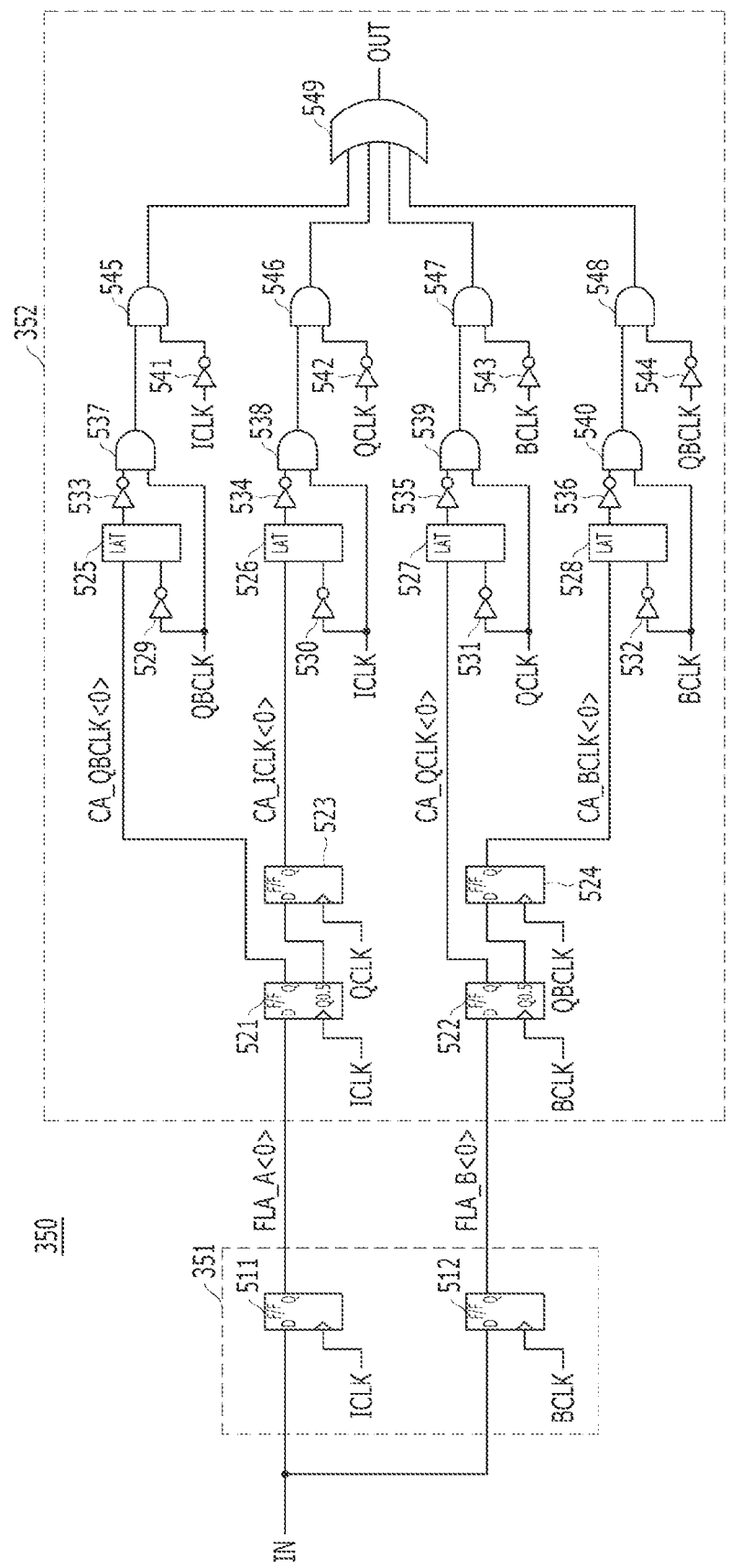
FIG. 5 is a configuration diagram of an embodiment of a control signal transmission circuit in FIG. 3.
Figure 6:
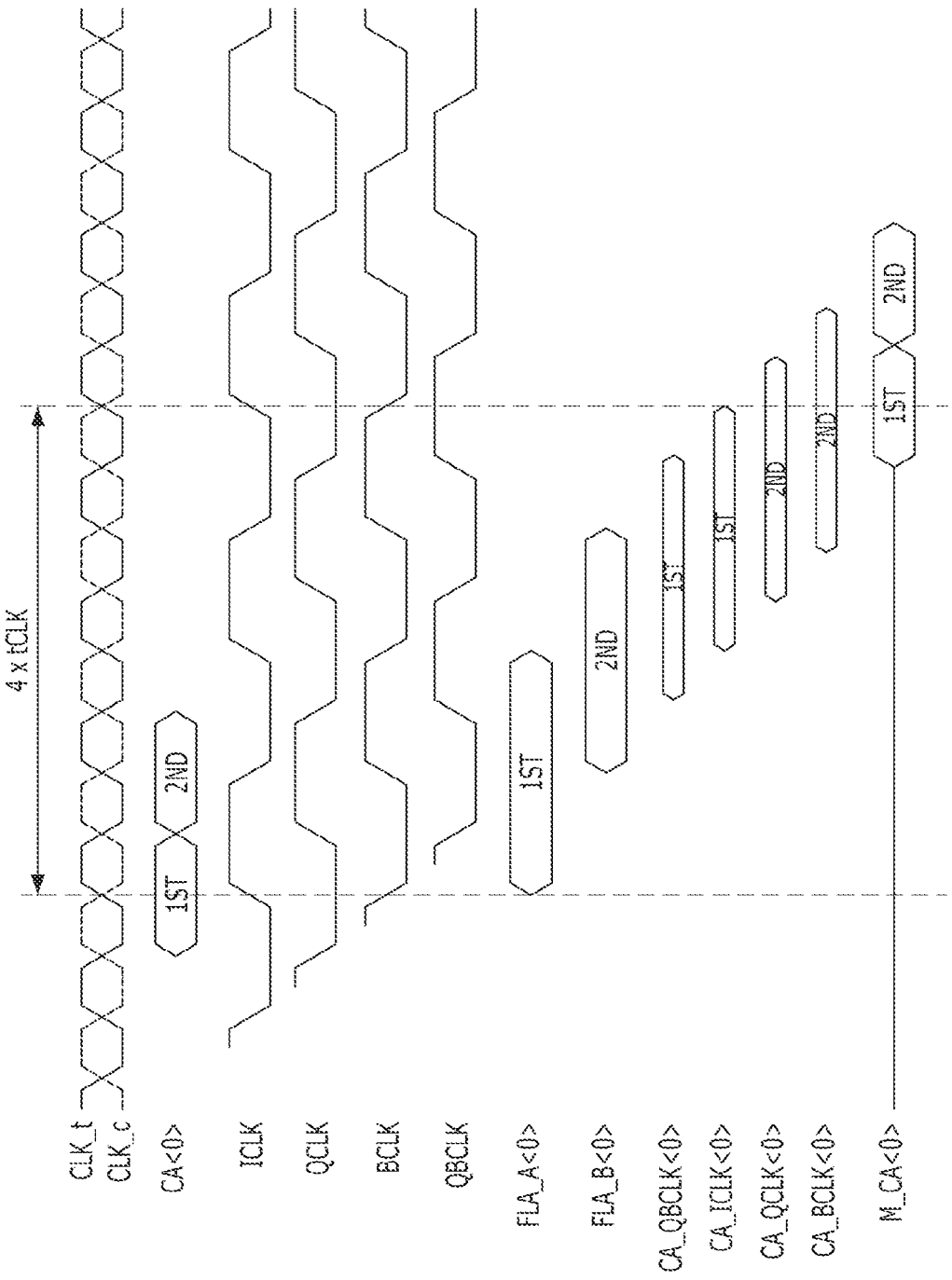
FIG. 6 is an example of an operation timing diagram of the control signal transmission circuit in FIG. 5.

FIG. 5 is a configuration diagram of an embodiment of the control signal transmission circuit 350 in FIG. 3, and FIG. 6 is an example of an operation timing diagram of the control signal transmission circuit 350. FIG. 5 illustrates components for transmitting the command address signal CA<0> in the control signal transmission circuit 350. The remaining control signals CA<1:13> and CS<0:3> may also be transmitted in the same way as the command address signal CA<0>.

Referring to FIG. 5, the setup and hold latch circuit 351 of the control signal transmission circuit 350 may include D flip-flops 511 and 512. An input IN of the D flip-flops 511 and 512 may be an output of a buffer of the command address reception circuit 315 in FIG. 3, which receives the command address signal CA<0>. The D flip-flop 511 may receive an input at a rising edge of a first clock ICLK, latch the received input, and output a signal FLA_A<0>, and the D flip-flop 512 may receive an input at a rising edge of a third clock BCLK, latch the received input, and output a signal FLA_B<0>. Referring to FIG. 6 together, a signal 1ST of a first cycle of the command address signal CA<0> may be latched by the D flip-flop 511 and output as the signal FLA_A<0>, and a signal 2ND of a second cycle of the command address signal CA<0> may be latched by the D flip-flop 512 and output as the signal FLA_B<0>.

The transmission control circuit 352 of the control signal transmission circuit 350 may include D flip-flops 521 to 524, D latches 525 to 528, inverters 529 to 536 and 541 to 544, AND gates 537 to 540 and 545 to 548, and an OR gate 549.

Figure 7:
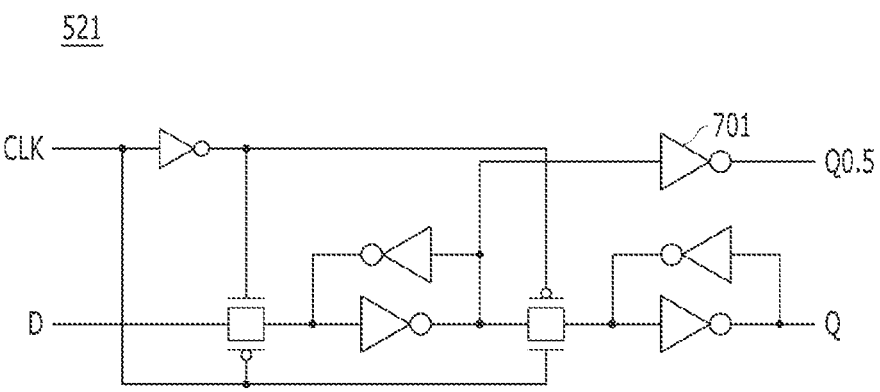
FIG. 7 is a diagram illustrating an embodiment of an internal configuration of a D flip-flop.

The D flip-flop 521 may receive and latch the signal FLA_A<0> at the rising edge of the first clock ICLK. A signal output as an output Q of the D flip-flop 521 is indicated by CA_QBCLK<0>. An output Q 0.5 of the D flip-flop 521 may be an output of a first stage of the D flip-flop 521 including two stages. FIG. 7 illustrates the internal configuration of an example of the D flip-flop 521, and the D flip-flop 521 may further include an inverter 701 for outputting the output Q 0.5 from a latch of the first stage in addition to the configuration of a general D flip-flop. The D flip-flop 523 may receive and latch the output Q 0.5 of the D flip-flop 521 at a rising edge of the second clock QCLK, and output the latched output as a signal CA_ICLK<0>. Referring to FIG. 6, the signals CA_QBCLK<0> and CA_ICLK<0> may have a phase difference equal to a phase difference between the first clock ICLK and the second clock QCLK.

The D flip-flop 522 may receive and latch the signal FLA_B<0> at the rising edge of the third clock BCLK. A signal output as an output Q of the D flip-flop 522 is indicated by CA_QCLK<0>. The D flip-flop 524 may receive and latch an output Q 0.5 of the D flip-flop 522 at a rising edge of the fourth clock QBCLK, and output the latched output as a signal CA_BCLK<0>. Referring to FIG. 6, the signals CA_QCLK<0> and CA_BCLK<0> may have a phase difference equal to a phase difference between the third clock BCLK and the fourth clock QBCLK.

The D latch 525 may latch and output the signal CA_QBCLK<0> while the fourth clock QBCLK is at a low level, an output of the D latch 525 may be inverted by the inverter 533, and an output of the inverter 533 and the fourth clock QBCLK may be input to the AND gate 537. An output of the AND gate 537 may be input to the AND gate 545 together with the first clock ICLK inverted by the inverter 541.

The D latch 526 may latch and output the signal CA_ICLK<0> while the first clock ICLK is at a low level, an output of the D latch 526 may be inverted by the inverter 534, and an output of the inverter 534 and the first clock ICLK may be input to the AND gate 538. An output of the AND gate 538 may be input to the AND gate 546 together with the second clock QCLK inverted by the inverter 542.

The D latch 527 may latch and output the signal CA_QCLK<0> while the second clock QCLK is at a low level, an output of the D latch 527 may be inverted by the inverter 535, and an output of the inverter 535 and the second clock QCLK may be input to the AND gate 539. An output of the AND gate 539 may be input to the AND gate 547 together with the third clock BCLK inverted by the inverter 543.

The D latch 528 may latch and output the signal CA_BCLK<0> while the third clock BCLK is at a low level, an output of the D latch 528 may be inverted by the inverter 536, and an output of the inverter 536 and the third clock BCLK may be input to the AND gate 540. An output of the AND gate 540 may be input to the AND gate 548 together with the fourth clock QBCLK inverted by the inverter 544.

Outputs of the AND gates 545 to 548 may be input to the OR gate 549, and an output OUT of the OR gate 549 may be an input of a driver of the command address transmission circuit 335 in FIG. 3, which transmits the command address signal M_CA<0>.

Referring to FIG. 6, the command address signal CA<0> received from the memory interface 115 (FIG. 1) by the command address reception circuit 315 of the buffer chip 220 may be buffered by the control signal transmission circuit 350, delayed by 4 clock cycles based on the clocks CLK_t and CLK_c, and transmitted to the memory chips 231 to 234 (FIG. 2) by the command address transmission circuit 335.

Figure 8:
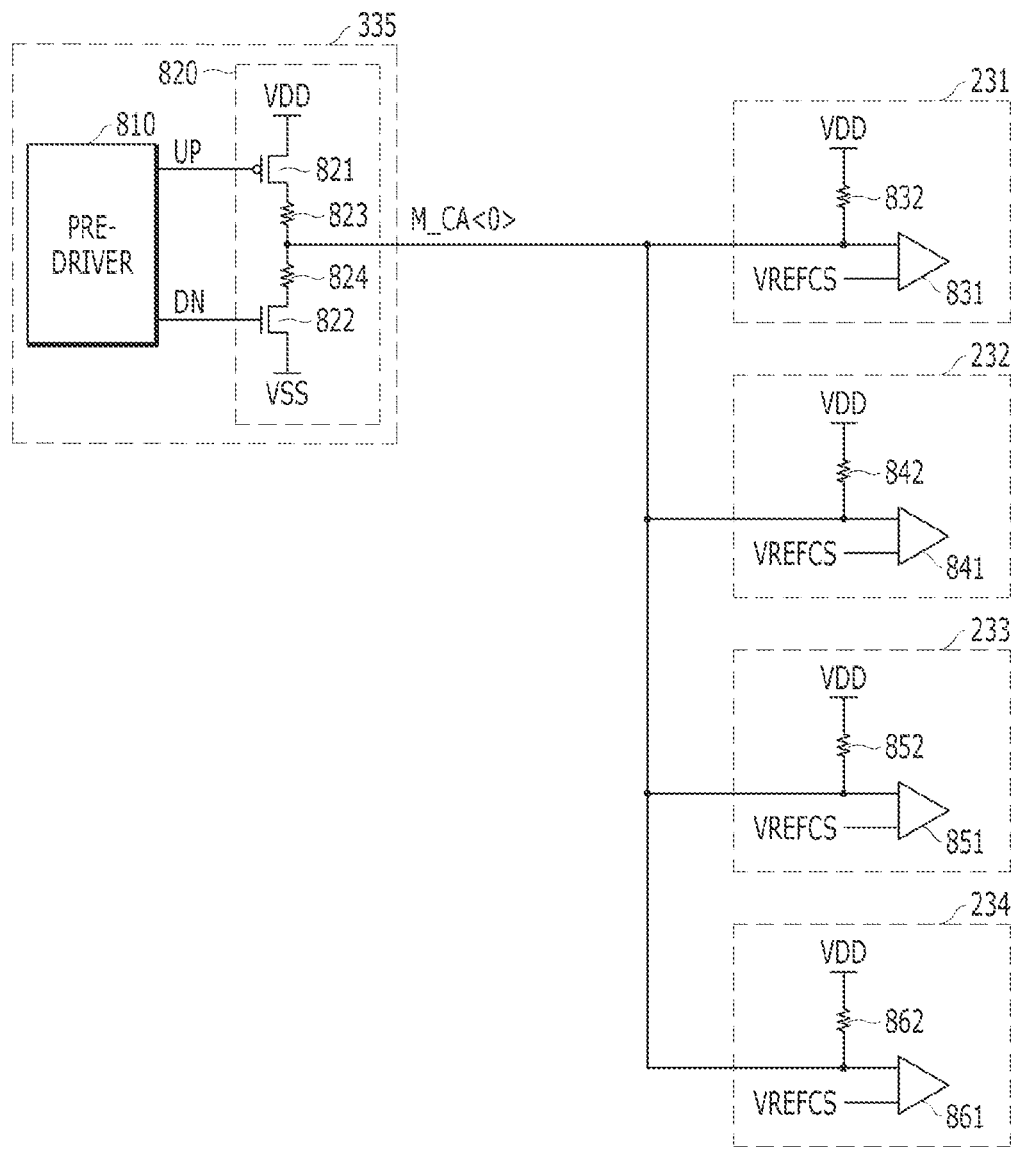
FIG. 8 is a diagram illustrating an embodiment of a portion of a command address transmission circuit of the buffer chip, which transmits a command address signal, and buffers of memory chips, which receive the command address signal.

FIG. 8 is a diagram illustrating an embodiment of a portion of the command address transmission circuit 335 of the buffer chip 220 (FIG. 3), which transmits the command address signal M_CA<0>, and buffers of memory chips 231 to 234, which receive the command address signal M_CA<0>. Portions of transmitting and receiving the remaining 13 command address signals M_CA<1:13> may also be configured as illustrated in FIG. 8.

Referring to FIG. 8, the command address transmission circuit 335 may include a pre-driver 810 and a main driver 820.

The pre-driver 810 may generate control signals UP and DN of the main driver 820 according to the logic level of the command address signal M_CA<0> to be transmitted. When the command address signal M_CA<0> to be transmitted is at a high level, the pre-driver 810 may activate the control signal UP to a low level, and when the command address signals M_CA<0:13> to be transmitted are at a low level, the pre-driver 810 may activate the control signal DN to a high level.

The main driver 820 may include a PMOS transistor 821, an NMOS transistor 822, and resistors 823 and 824. When the control signal UP is activated to a low level, the PMOS transistor 821 is turned on, so that the command address signal M_CA<0> may be driven to a high level through the PMOS transistor 821 and the resistor 823. When the control signal DN is activated to a high level, the NMOS transistor 822 is turned on, so that the command address signal M_CA<0> may be driven to a low level through the NMOS transistor 822 and the resistor 824.

The memory chip 231 may receive the command address signal M_CA<0> by using a reception buffer 831. The resistor 832 is a termination resistor used at a receiving terminal side of the memory chip 231 to prevent or mitigate signal reflection. The other memory chips 232 to 234 may also receive the command address signal M_CA<0> by using reception buffers 841, 851 and 861, and may include termination resistors 842, 852 and 862, respectively.

When the command address signal M_CA<0> at a high level is transmitted from the command address transmission circuit 335 to the memory chips 231 to 234, a lot of current is not consumed because no current path is formed in the memory chips 231 to 234. However, when the command address signal M_CA<0> at a low level is transmitted from the command address transmission circuit 335 to the memory chips 231 to 234, a lot of current may be consumed because a current path is formed from a power supply voltage terminal VDD to a ground terminal VSS through the termination resistors 832, 842, 852 and 862 of the memory chips 231 to 234 and the NMOS transistor 822 and the resistor 824 of the main driver 820. That is, when a pull-up termination scheme is used at receiving terminals of the memory chips 231 to 234 as illustrated in FIG. 8, a lot of current may be consumed when a low-level signal is transmitted from the buffer chip 220 to the memory chips 231 to 234. On the other hand, when a pull-down termination scheme is used at the receiving terminals of the memory chips 231 to 234, a lot of current may be consumed when a high-level signal is transmitted from the buffer chip 220 to the memory chips 231 to 234.

Figure 9:
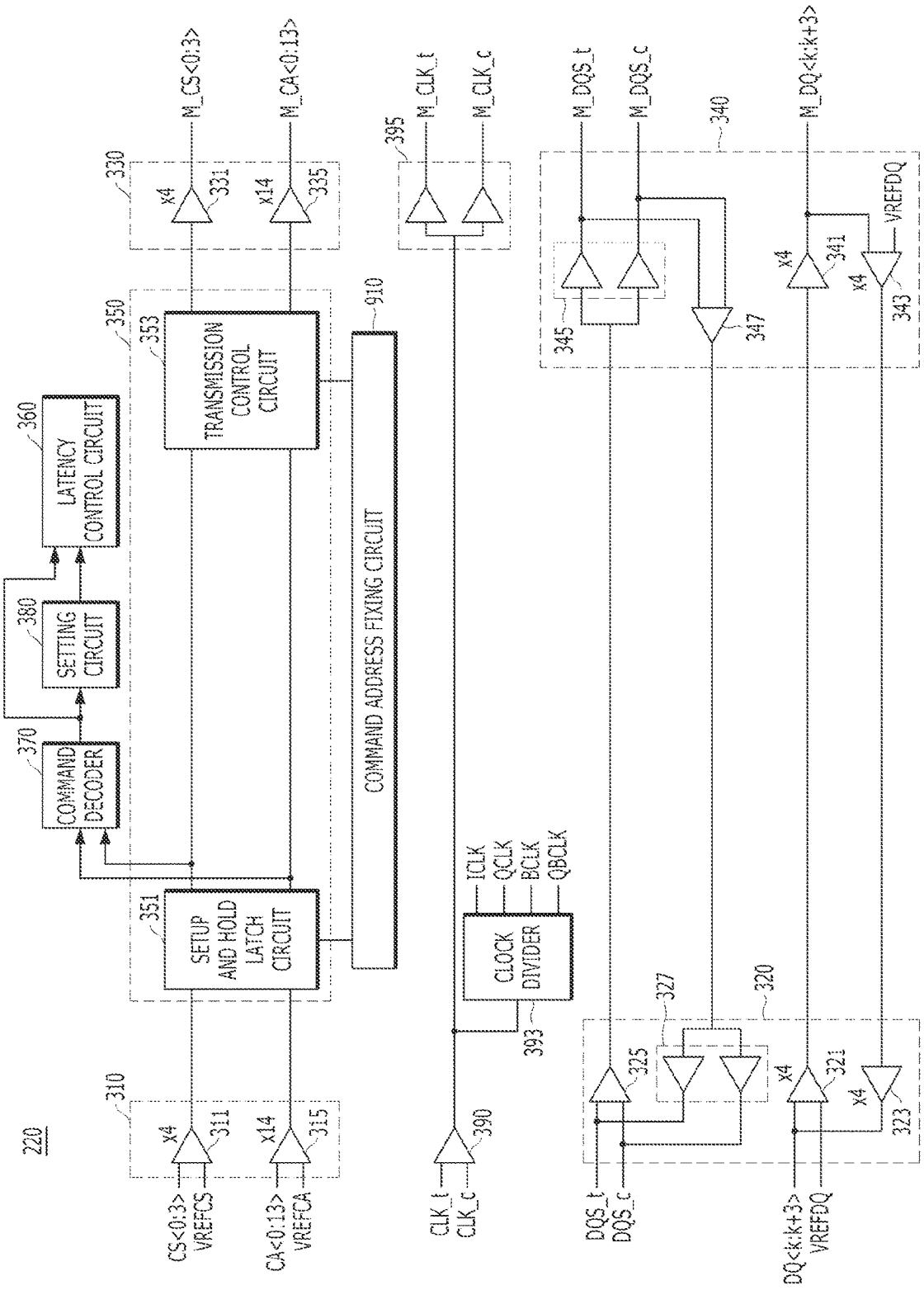
FIG. 9 is a configuration diagram of another embodiment of the buffer chip in FIG. 3.

FIG. 9 is a configuration diagram of another embodiment of the buffer chip 220 in FIG. 3. In FIG. 9, an embodiment in which current consumption of the memory chips 231 to 234 can be reduced by fixing the levels of the command address signals M_CA<0:13> in a period in which the command address signals M_CA<0:13> are not valid will be described.

Referring to FIG. 9, the buffer chip 220 may include the external control signal interface 310, the external data interface 320, the internal control signal interface 330, the internal data interface 340, the control signal transmission circuit 350, the latency control circuit 360, the command decoder 370, the setting circuit 380, the clock reception circuit 390, the clock divider 393, the clock transmission circuit 395, and a command address fixing circuit 910.

In an embodiment, the command address fixing circuit 910 may reduce current consumption of the memory chips 231 to 234 by fixing the levels of the command address signals M_CA<0:13> in a period in which the chip select signals M_CS<0:3> are not activated. The chip select signals M_CS<0:3> are signals indicating the validity of the command address signals M_CA<0:13>. For example, when the chip select signal M_CS<2> is activated to a low level, it may mean that the memory chip 233 needs to validly receive and decode the command address signals M_CA<0:13>, and when the chip select signal M_CS<3> is deactivated to a high level, it may mean that the memory chip 234 needs not to decode the command address signals M_CA<0:13>. Accordingly, when the chip select signals M_CS<0:3> are all deactivated, the command address fixing circuit 910 may fix the levels of the command address signals M_CA<0:13>.

When it is confirmed that the chip select signals M_CS<0:3> are not activated for a certain period, the command address fixing circuit 910 may fix the levels of the command address signals M_CA<0:13> to a high level, thereby reducing a current consumed by the memory chips 231 to 234 in order to receive the command address signals M_CA<0:13>. In an embodiment, because the memory chips 231 to 234 use a pull-up termination scheme in order to receive the command address signals M_CA<0:13>, when the levels of the command address signals M_CA<0:13> are fixed to a high level, current consumption of the memory chips 231 to 234 may be reduced. In an embodiment, when the memory chips 231 to 234 use a pull-down termination scheme in order to receive the command address signals M_CA<0:13>, the command address fixing circuit 910 may reduce current consumption of the memory chips 231 to 234 by fixing the levels of the command address signals M_CA<0:13> to a low level.

The command address fixing circuit 910 may confirm the logic levels of the chip select signals M_CS<0:3> being transmitted by the control signal transmission circuit 350. When it is confirmed that the chip select signals M_CS<0:3> are not activated for a certain period, the command address fixing circuit 910 may fix the logic levels of the command address signals M_CA<0:13> transmitted from the control signal transmission circuit 350.

Figure 10:
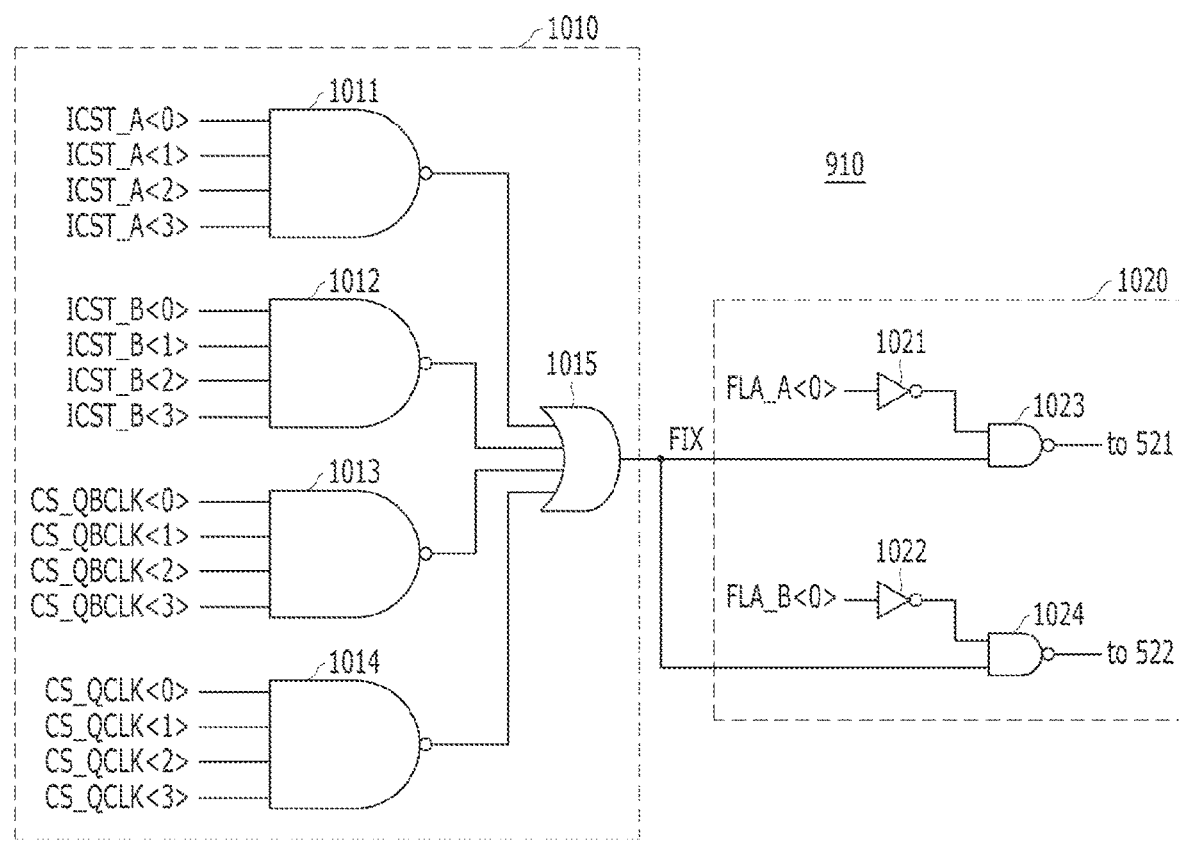
FIG. 10 is a configuration diagram of an embodiment of a command address fixing circuit in FIG. 9.

FIG. 10 is a configuration diagram of an embodiment of the command address fixing circuit 910 in FIG. 9.

Referring to FIG. 10, the command address fixing circuit 910 may include a fixed signal generation unit 1010 and a fixing unit 1020.

The fixed signal generation unit 1010 may generate a fixed signal FIX that is activated to a low level when the logic levels of the chip select signals M_CS<0:3> transmitted from various stages of the control signal transmission circuit 350 are all high levels. The fixed signal generation unit 1010 may include NAND gates 1011 to 1014 and an OR gate 1015 for generating the fixed signal FIX that is activated to a low level when the logic levels of signals ICST_A<0:3>, ICST_B<0:3>, CS_QBCLK<0:3>, and CS_QCLK(0:3>) are all high levels.

The signals ICST_A<0:3> may be signals of the same stage as FLA_A<0> of FIG. 5 of the chip select signals M_CS<0:3> being transmitted by the control signal transmission circuit 350. That is, the signals ICST_A<0:3> may be signals obtained by aligning, by the D flip-flop using the first clock ICLK, the chip select signals CS<0:3> received by the chip select signal reception circuit 311.

The signals ICST_B<0:3> may be signals of the same stage as FLA_B<0> in FIG. 5 of the chip select signals M_CS<0:3> being transmitted by the control signal transmission circuit 350. That is, the signals ICST_B<0:3> may be signals obtained by aligning, by the D flip-flop using the third clock BCLK, the chip select signals CS<0:3> received by the chip select signal reception circuit 311.

The signals CS_QBCLK<0:3 may be signals of the same stage as CA_QBCLK<0> of FIG. 5 of the chip select signals M_CS<0:3> being transmitted by the control signal transmission circuit 350. That is, the signals CS_QBCLK<0:3 may be signals obtained by aligning the signals ICST_A<0:3> by the D flip-flop using the first clock ICLK.

The signals CS_QCLK<0:3> may be signals of the same stage as CA_QCLK<0> of FIG. 5 of the chip select signals M_CS<0:3> being transmitted by the control signal transmission circuit 350. That is, the signals CS_QCLK<0:3> may be signals obtained by aligning the signals ICST_B<0:3> by the D flip-flop using the third clock BCLK.

When the signals ICST_A<0:3>, ICST_B<0:3>, CS_QBCLK<0:3>, and CS_QCLK<0:3> are all at a high level, the fixed signal FIX is activated to a low level. The fact that the signals ICST_A<0:3>, ICST_B<0:3>, CS_QBCLK<0:3>, and CS_QCLK<0:3> are all at a high level means that the chip select signals M_CS<0:3> are at a high level in several stages in the control signal transmission circuit 350. That is, this may mean a period in which the chip select signals M_CS<0:3> are deactivated for a considerable period.

The fixing unit 1020 may fix the levels of the command address signals M_CA<0:13> in response to the fixed signal FIX. FIG. 10 illustrates a portion of the fixing unit 1020 that fixes the levels of the command address signal M_CA<0>. Portions that fix the levels of the remaining command address signals M_CA<1:13> may also be configured in the same manner. The fixing unit 1020 may include inverters 1021 and 1022 and NAND gates 1023 and 1024. When the fixed signal FIX is activated to a low level, output signals of the NAND gates 1023 and 1024 may be fixed to a high level regardless of the levels of the signals FLA_A<0> and FLA_B<0>. The signals FLA_A<0> and FLA_B<0> may be signals corresponding to the command address signal M_CA<0> being transmitted by the control signal transmission circuit 350 and may be understood with reference to FIG. 5.

Referring to FIGS. 9 and 10, in an embodiment, the command address fixing circuit 910 may fix the levels of the command address signals M_CA<0:13> in a period in which the chip select signals M_CS<0:3> are deactivated, that is, in a period in which the command address signals M_CA<0:13> are not valid, thereby reducing the amount of current used by the memory chips 231 to 234 in order to receive the command address signals M_CA<0:13>.

Referring now back to FIG. 8, the memory chips 231 to 234 use the termination resistors 832, 842, 852, and 862 in order to receive the command address signal M_CA<0>, respectively. The memory chips 231 to 234 also use the termination resistors in order to receive the remaining command address signals M_CA<1:13>, clock M_CLK, and chip select signals M_CS<0:3>. The resistance values (also referred to as RTT) of the termination resistors used when the memory chips 231 to 234 receive the signals M_CA<0:13>, M_CS<0:3>, M_CLK_t, and M_CLK_c may be set by setting operations of the memory chips 231 to 234. However, the termination resistance values of the memory chips 231 to 234 need to be determined even before the setting operations of the memory chips 231 to 234 are performed, and initial termination setting pads may be used in order to set initial values of such termination resistance values. The initial resistance values of the termination resistors used when the memory chips receive the signals M_CA<0:13>, M_CS<0:3>, M_CLK_t, and M_CLK_c may vary according to whether the initial termination setting pad is at a high level or a low level. The initial termination setting pads may be CA ODT pads.

FIG. 11 is a table illustrating an example of initial values of termination resistors according to voltage levels of the termination setting pads CA ODT. When the power supply voltage VDD is connected to the termination setting pad CA ODT, that is, is at a high level, termination resistors used when the memory chips 231 to 234 receive the clocks M_CLK_t and M_CLK_c and termination resistors used when the memory chips 231 to 234 receive the chip select signals M_CS<0:3> may each have a resistance value of 40Ω. Termination resistors used when the memory chips 231 to 234 receive the command address signals M_CA<0:13> may each have a resistance value of 80Ω. When the ground voltage VSS is connected to the termination setting pad CA ODT, that is, is at a low level, termination resistors used when the memory chips 231 to 234 receive the clocks M_CLK_t and M_CLK_c, the chip select signals M_CS<0:3>, and the command address signals M_CA<0:13> may be turned off.

Figure 12:
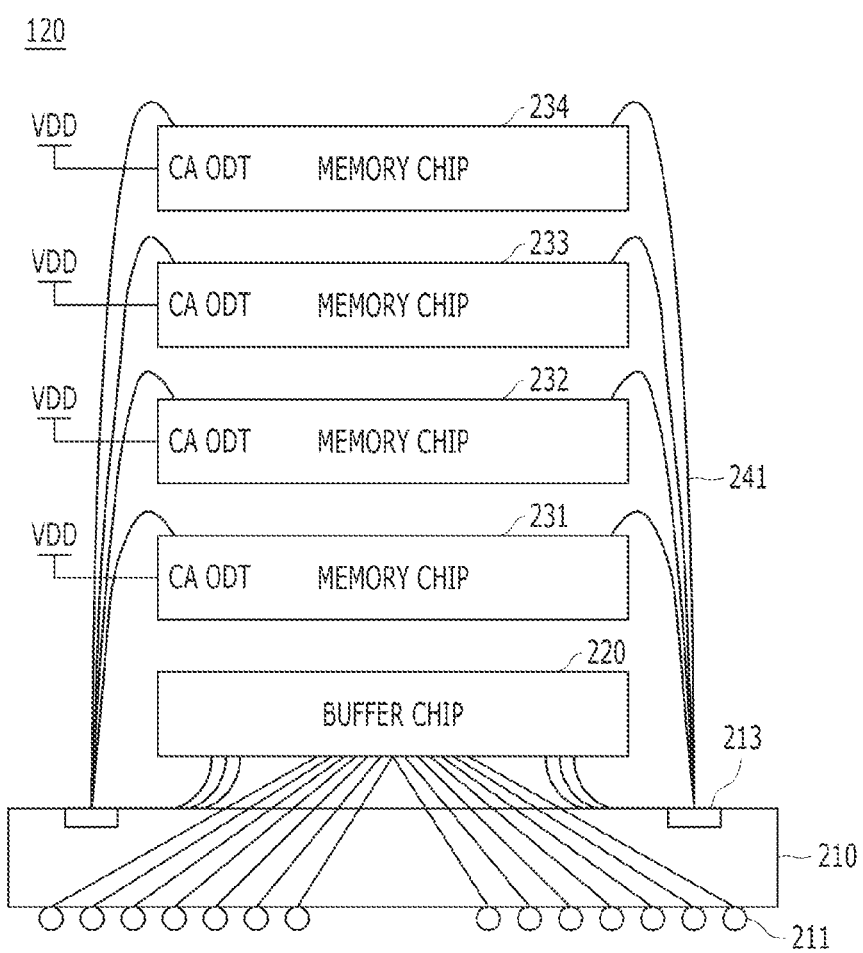
FIG. 12 is an example of connection of the termination setting pads of the memory chips of the memory package in FIG. 2.

FIG. 12 is an example of connection of the termination setting pads CA ODT of the memory chips 231 to 234 of the memory package 120 in FIG. 2.

Referring to FIG. 12, the power supply voltage VDD may be connected to all the termination setting pads CA ODT of the memory chips 231 to 234. Accordingly, the initial values of termination resistors used when the memory chips 231 to 234 receive the clocks M_CLK_t and M_CLK_c and termination resistors used when the memory chips 231 to 234 receive the chip select signals M_CS<0:3> may each be 40Ω. The initial values of termination resistors used when the memory chips 231 to 234 receive the command address signals M_CA<0:13> may each be 80Ω.

The memory chips 231 to 234 receive independent chip select signals M_CS<0:3>, respectively, but receive the clocks M_CLK_t and M_CLK_c and the command address signals M_CA<0:13> in common. Accordingly, the effective resistance values of termination resistors used when the memory chips 231 to 234 receive the chip select signals M_CS<0:3> may each be 40Ω. However, the effective resistance values of termination resistors used when the memory chips 231 to 234 receive the clocks M_CLK_t and M_CLK_c may each be 10Ω (parallel connection of four 40Ω resistors), and the effective resistance values of termination resistors used when the memory chips 231 to 234 receive the command address signals M_CA<0:13> may each be 20Ω (parallel connection of four 80Ω resistors).

Figure 13:
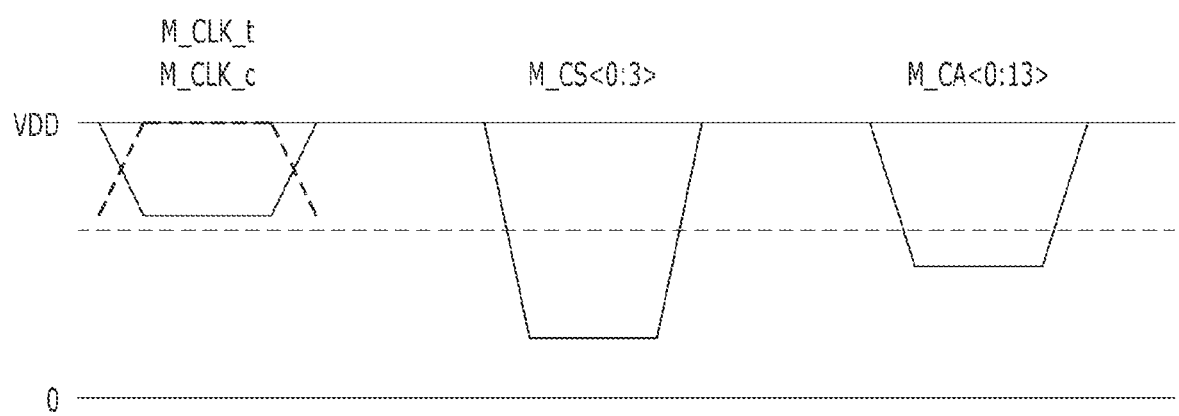
FIG. 13 is a diagram illustrating examples of swing widths of signals when termination setting pads of the memory chips are connected as illustrated in FIG. 12.

FIG. 13 is a diagram illustrating examples of swing widths of the signals M_CA<0:13>, M_CS<0:3>, M_CLK_t, and M_CLK_c when the termination setting pads CA ODT of the memory chips 231 to 234 are connected as illustrated in FIG. 12.

A dotted line in FIG. 13 may be a reference value for distinguishing high and low of the signals M_CA<0:13>, M_CS<0:3>, M_CLK_t, and M_CLK_c. Because the effective termination resistance values of the chip select signals M_CS<0:3> are each 40Ω, the logic level can transition from high to low. Because the effective termination resistance values of the command address signals M_CA<0:13> are each as small as 20Ω, it is difficult for the command address signals M_CA<0:13> to swing, and it can be seen that the logic level transitions from high to low. The effective termination resistance values of the clocks M_CLK_t and M_CLK_c are each too small as 10Ω. That is, the transmission lines of the clocks M_CLK_t and M_CLK_c are pulled up very strongly by termination resistors. Accordingly, it can be seen that the clocks M_CLK_t and M_CLK_c do not transition from high to low.

That is, in an embodiment, when the termination setting pads CA ODT of the memory chips 231 to 234 are connected as illustrated in FIG. 12, because the initial effective value of termination resistors for receiving the signals M_CA<0:13>, M_CLK_t, and M_CLK_c is set to be too small, the signals M_CA<0:13>, M_CLK_t, and M_CLK_c might not swing with a sufficient margin, resulting in problems in the initial operation of the memory chips 231 to 234.

Figure 14:
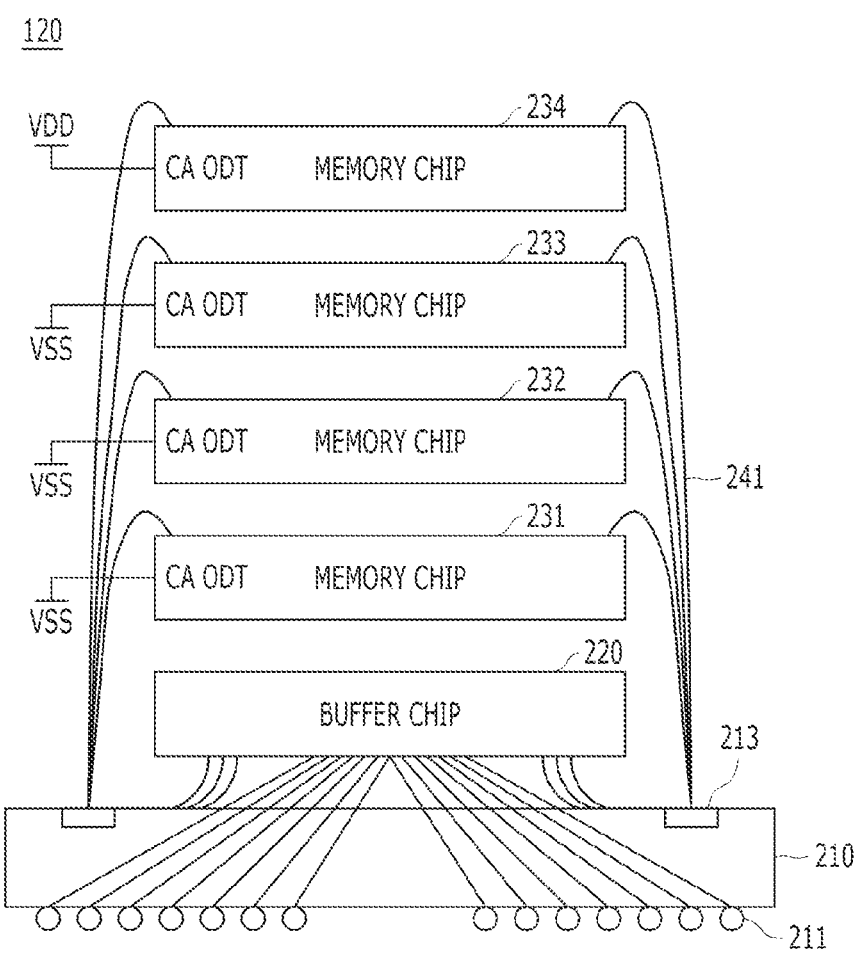
FIG. 14 is another example of connection of the termination setting pads of the memory chips of the memory package in FIG. 2.

FIG. 14 is another example of connection of the termination setting pads CA ODT of the memory chips 231 to 234 of the memory package 120 in FIG. 2.

Referring to FIG. 14, the power supply voltage VDD may be connected to the termination setting pad CA ODT of one memory chip 234 of the memory chips 231 to 234. The initial value of a termination resistor used when the memory chip 234 receives the clocks M_CLK_t and M_CLK_c and the initial value of a termination resistor used when the memory chip 234 receives the chip select signals M_CS<0:3> may each be 40Ω, and the initial value of a termination resistor used when the memory chip 234 receives the command address signals M_CA<0:13> may be 80Ω.

The ground voltage VSS may be connected to the termination setting pads CA ODT of the memory chips 231 to 233. Accordingly, termination resistors used to receive the signals M_CA<0:13>, M_CS<0:3>, M_CLK_t, and M_CLK_c at the beginning of operation of the memory chips 231 to 233 may be turned off.

Because the memory chips 231 to 234 receive the independent chip select signals M_CS<0:3>, respectively, the effective values of termination resistors used when the memory chips 231 to 233 receive the chip select signals M_CS<0:2> may each be 40Ω, and the effective value of the termination resistor used when the memory chip 234 receives the chip select signal M_CS<3> may be 0Ω.

Because the memory chips 231 to 234 receive the clocks M_CLK_t and M_CLK_c and the command address signals M_CA<0:13> in common, the effective values of termination resistors used when the memory chips 231 to 234 receive the clocks M_CLK_t and M_CLK_c may each be 40Ω, and the effective values of termination resistors used when the memory chips 231 to 234 receive the command address signals M_CS<0:13> may each be 80Ω.

Figure 15:
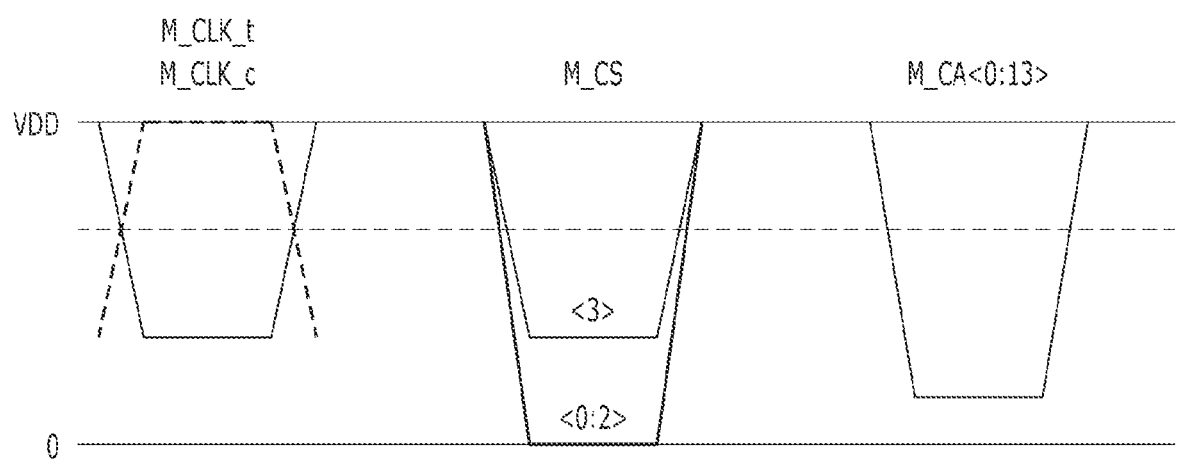
FIG. 15 is a diagram illustrating examples of swing widths of signals when the termination setting pads of the memory chips are connected as illustrated in FIG. 14.

FIG. 15 is a diagram illustrating examples of swing widths of signals M_CA<0:13>, M_CS<0:3>, M_CLK_t, and M_CLK_c when the termination setting pads CA ODT of the memory chips 231 to 234 are connected as illustrated in FIG. 14.

A dotted line in FIG. 15 may be a reference value for distinguishing high and low of the signals M_CA<0:13>, M_CS<0:3>, M_CLK_t, and M_CLK_c. Because the effective termination resistance values of the chip select signals M_CS<0:2> are each 40Ω, the logic level can transition from high to low. Because the effective termination resistance value of the chip select signal M_CS<3> is 0Ω, the swing width is reduced, but it can be seen that the logic level can transition from high to low. Because the chip select signal M_CS<3> is not a signal that is transmitted/received with a high frequency like the clocks M_CLK_t and M_CLK_c, the logic level can transition from high to low even though the effective termination resistance value is 0Ω.

Because the command address signals M_CA<0:13> have an appropriate effective termination resistance value of 80Ω, the signals can transition from high to low with a sufficient margin. Because the effective termination resistance values of the clocks M_CLK_t and M_CLK_c are each 40Ω as an appropriate value, the clocks can transition from high to low with a sufficient margin.

That is, as illustrated in FIG. 14, when a high-level voltage VDD is applied to the termination setting pads CA ODT of the memory chip 234 and a low-level voltage VSS is applied to the termination setting pads CA ODT of the remaining memory chips 231 to 233 among the memory chips 231 to 234, in an embodiment, the initial effective value of termination resistors for receiving the signals M_CA<0:13>, M_CS<0:3>, M_CLK_t, and M_CLK_c may be appropriately set and the initial operations of the memory chips 231 to 234 may be performed without problems.

Figure 16:
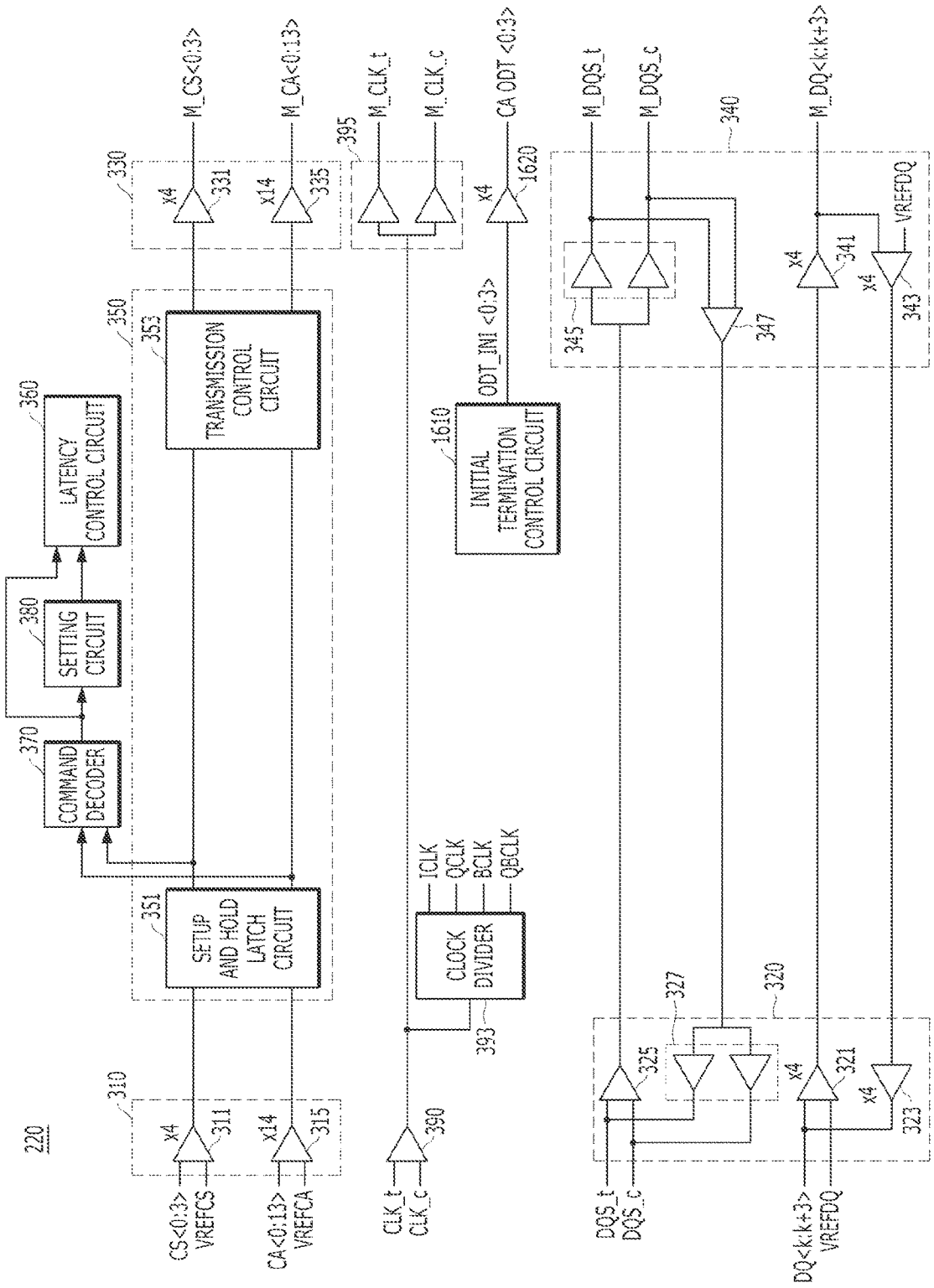
FIG. 16 is a configuration diagram of further another embodiment of the buffer chip in FIG. 3.

FIG. 16 is a configuration diagram of further another embodiment of the buffer chip 220 in FIG. 3. In FIG. 16, an embodiment in which unlike in FIG. 14, a fixed external voltage is not connected to the termination setting pads CA ODT of the memory chips 231 to 234 and the termination setting pads CA ODT of the memory chips 231 to 234 are connected to the buffer chip 220 will be described.

Referring to FIG. 16, the buffer chip 220 may include the external control signal interface 310, the external data interface 320, the internal control signal interface 330, the internal data interface 340, the control signal transmission circuit 350, the latency control circuit 360, the command decoder 370, the setting circuit 380, the clock reception circuit 390, the clock divider 393, the clock transmission circuit 395, an initial termination control circuit 1610, and an initial resistance value signal transmission circuit 1620.

The initial termination control circuit 1610 may generate initial termination resistance value signals ODT_INI<0:3> for setting initial termination resistance values of the memory chips 231 to 234. The initial termination control circuit 1610 may include a ROM such as a fuse circuit. In this case, levels of the initial termination resistance value signals ODT_INI<0:3> may be determined according to programming of the ROM. Alternatively, the initial termination control circuit 1610 may generate the initial termination resistance value signals ODT_INI<0:3> having values determined according to setting of the setting circuit 380, that is, according to an instruction of the memory controller.

The initial resistance value signal transmission circuit 1620 may transmit the initial termination resistance value signals ODT_INI<0:3> generated by the initial termination control circuit 1610 to the memory chips 231 to 234. The initial resistance value signal transmission circuit 1620 may transmit the initial termination resistance value signal ODT_INI<0> to the initial termination setting pad CA ODT<0> (<0> is written for distinction) of the memory chip 231, transmit the initial termination resistance value signal ODT_INI<1> to the initial termination setting pad CA ODT<1> of the memory chip 232, transmit the initial termination resistance value signal ODT_INI<2> to the initial termination setting pad CA ODT<2> of the memory chip 233, and transmit the initial termination resistance value signal ODT_INI<3> to the initial termination setting pad CA ODT<3> of the memory chip 234. The initial resistance value signal transmission circuit 1620 may include four transmission drivers for transmitting the four signals ODT_INI<0:3>.

The initial resistance value signal transmission circuit 1610 and the initial termination setting pads CA ODT<0:3> of the memory chips 231 to 234 may be connected through the package substrate 210, the bonding pads 213, and the wires 241 like other signals.

The initial termination resistance values of the memory chips 231 to 234 may be controlled by the buffer chip 220 by using the initial termination control circuit 1610 and the initial resistance value signal transmission circuit 1620.

As another embodiment, the initial resistance value signal transmission circuit 1620 may be configured to be activated/deactivated, and the initial termination setting pads CA ODT<0:3> of the memory chips 231 to 234 may be connected to the external voltages VDD and VSS as illustrated in FIG. 14. When the external voltages VDD and VSS are connected to the initial termination setting pads CA ODT<0:3>, it may be desirable to connect them using resistors having a large resistance value. When the initial resistance value signal transmission circuit 1620 is activated, the initial termination resistance values of the memory chips 231 to 234 may be determined by signals transmitted by the initial resistance value signal transmission circuit 1620 of the buffer chip 220, and when the initial resistance value signal transmission circuit 1620 is deactivated, the initial termination resistance values of the memory chips 231 to 234 may be determined by the external voltages VDD and VSS connected to the initial termination setting pads CA ODT<0:3>.

Figure 17:
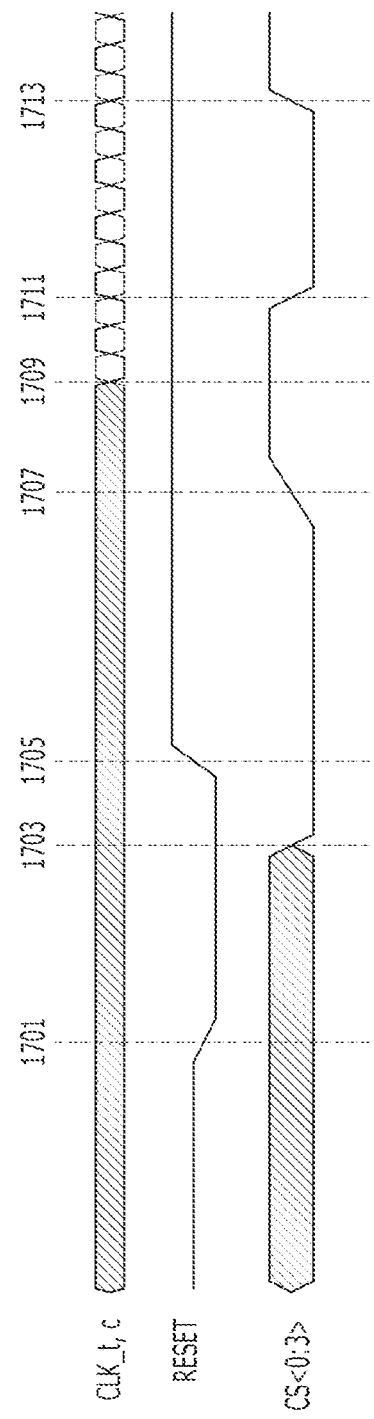
FIG. 17 is a timing diagram illustrating an example of signals transmitted from a memory controller to the buffer chip during an initialization operation.

FIG. 17 is a timing diagram illustrating an example of signals transmitted from the memory controller to the buffer chip 220 during an initialization operation. A hatched portion in the drawing may mean a period in which a corresponding signal is not applied.

Referring to FIG. 17, at a time point 1701, a reset signal RESET may be activated to a low level, so that a reset operation may be started. Various circuits of the buffer chip 220 and the memory chips 231 to 234 may be reset from the time point when the reset signal RESET is activated to a low level to a time point 1705, and this period is also referred to as a reset period.

From a time point 1703 to a time point 1707, the chip select signals CS<0:3> may be activated to a low level. The various circuits of the buffer chip 220 and the memory chips 231 to 234 may be initialized from the time point 1705 at which the reset signal RESET is deactivated to the time point 1707 at which the chip select signals CS<0:3> are deactivated. This period is also referred to as an initialization period.

The clocks CLK_t and CLK_c are not applied before a time point 1709, but start to be applied from the time point 1709. Subsequently, from a time point 1711 to a time point 1713, the chip select signals CS<0:3> may be activated to a low level. The activated chip select signals CS<0:3> may mean that the buffer chip 220 and the memory chips 231 to 234 need to operate in synchronization with the clocks CLK_t and CLK_c. That is, the buffer chip 220 and the memory chips 231 to 234 might not use the clocks CLK_t and CLK_c during the period before the time point 1713, and may perform operations synchronized with the clocks CLK_t and CLK_c after the time point 1713.

Referring now back to FIGS. 3, 5, and 6, the control signal transmission circuit 350 of the buffer chip 220 is used to buffer the chip select signals CS<0:3> and the command address signals CA<0:13> in synchronization with the first and fourth clocks ICLK, QCLK, BCLK, and QBCLK generated using the clocks CLK_t and CLK_c, and to transmit the buffered signals to the memory chips 231 to 234. The control signal transmission circuit 350 is inoperable unless the clocks CLK_t and CLK_c toggle, and because the clocks CLK_t and CLK_c are not applied to the buffer chip 220 before the time point 1709, the control signal transmission circuit 350 is inoperable.

When the control signal transmission circuit 350 fails to operate, the chip select signals CS<0:3> might not be transmitted to the memory chips 231 to 234. As a result, the initialization operations of the memory chips 231 to 234 might not be correctly performed, and the time point at which the memory chips 231 to 234 start operating in synchronization with the clocks CLK_t and CLK_c might not be defined. A similar problem may also occur in a self-refresh operation. During the self-refresh operation, the clocks CLK_t and CLK_c are not applied to the buffer chip 220, but the end of the self-refresh operation is controlled by the chip select signals CS<0:3>. That is, because the clocks CLK_t and CLK_c do not toggle during the self-refresh operation, the control signal transmission circuit 350 is not able to transmit the chip select signals CS<0:3>, but because the end of the self-refresh operation is controlled by the chip select signals CS<0:3>, a problem in which the self-refresh operation is not terminated may occur.

Figure 18:
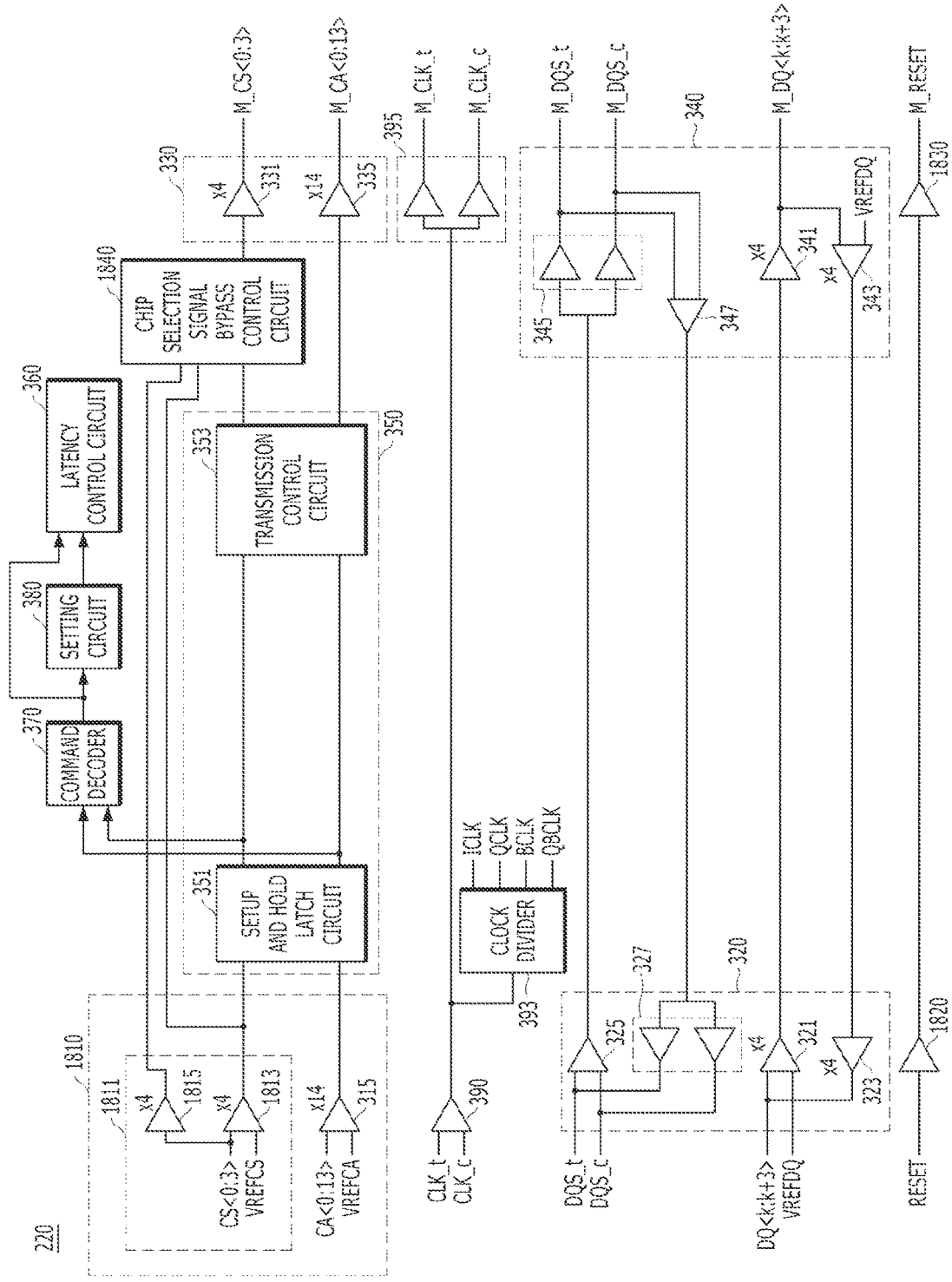
FIG. 18 is a configuration diagram of still another embodiment of the buffer chip in FIG. 3.

FIG. 18 is a configuration diagram of still another embodiment of the buffer chip 220 in FIG. 3. In FIG. 18, a buffer chip 220 capable of transmitting the chip select signals CS<0:3> to the memory chips 231 to 234 even in a period in which the clocks CLK_t and CLK_c are not applied will be described.

Referring to FIG. 18, the buffer chip 220 may include the external control signal interface 310, the external data interface 320, the internal control signal interface 330, the internal data interface 340, the control signal transmission circuit 350, the latency control circuit 360, the command decoder 370, the setting circuit 380, the clock reception circuit 390, the clock divider 393, the clock transmission circuit 395, a reset signal reception circuit 1820, a reset signal transmission circuit 1830, and a chip select signal bypass control circuit 1840.

The external control signal interface 1810 may receive control signals transmitted from the memory interface 115. The control signals may include the chip select signals CS<0:3> and the command address signals CA<0:13>. The external control signal interface 1810 may include a chip select signal reception circuit 1811 and a command address reception circuit 315. The chip select signal reception circuit 1811 may include four comparator-type buffers 1813 and four CMOS-type buffers 1815. The comparator-type buffers 1813 may receive the chip select signals CS<0:3> by comparing voltage levels of the chip selection reference voltage VREFCS and the chip select signals CS<0:3> with each other. The CMOS-type buffers 1815 may receive the chip select signals CS<0:3> without using a reference voltage. The comparator-type buffers 1813 and the CMOS-type buffers 1815 may be activated or deactivated by the chip select signal bypass control circuit 1840. The comparator-type buffers 1813 have a larger area and consume more current than the CMOS-type buffers 1815, but can stably operate at a higher speed than the CMOS-type buffers 1815.

The reset signal reception circuit 1820 may receive the reset signal RESET from the memory interface. The reset signal RESET may be a signal used to reset various logic circuits of the buffer chip 220 and memory chips 231 to 234. The reset signal reception circuit 1820 may include a reception buffer that receives the reset signal RESET.

The reset signal transmission circuit 1830 may transmit a reset signal M_RESET to the memory chips 231 to 234. The reset signal M_RESET may be commonly transmitted to the memory chips 231 to 234. The reset signal transmission circuit 1820 may include a transmission driver.

In an asynchronous mode, the chip select signal bypass control circuit 1840 may control the chip select signal transmission circuit 331 to transmit the chip select signals M_CS<0:3> having bypassed the control signal transmission circuit 350, and in a synchronous mode, the chip select signal bypass control circuit 1840 may control the chip select signal transmission circuit 331 to transmit the chip select signals M_CS<0:3> having passed through the control signal transmission circuit 350. The asynchronous mode and the synchronous mode may be determined by the chip select signal bypass control circuit 1840, and the asynchronous mode may include a period in which the clocks CLK_t and CLK_c are deactivated. Accordingly, even in a period in which the control signal transmission circuit 350 is inoperable because the clocks CLK_t and CLK_c are deactivated, such as an initialization period or a self-refresh period, the chip select signals M_CS<0:3> having bypassed the control signal transmission circuit 350 may be transmitted to the memory chips 231 to 234.

Figure 19:
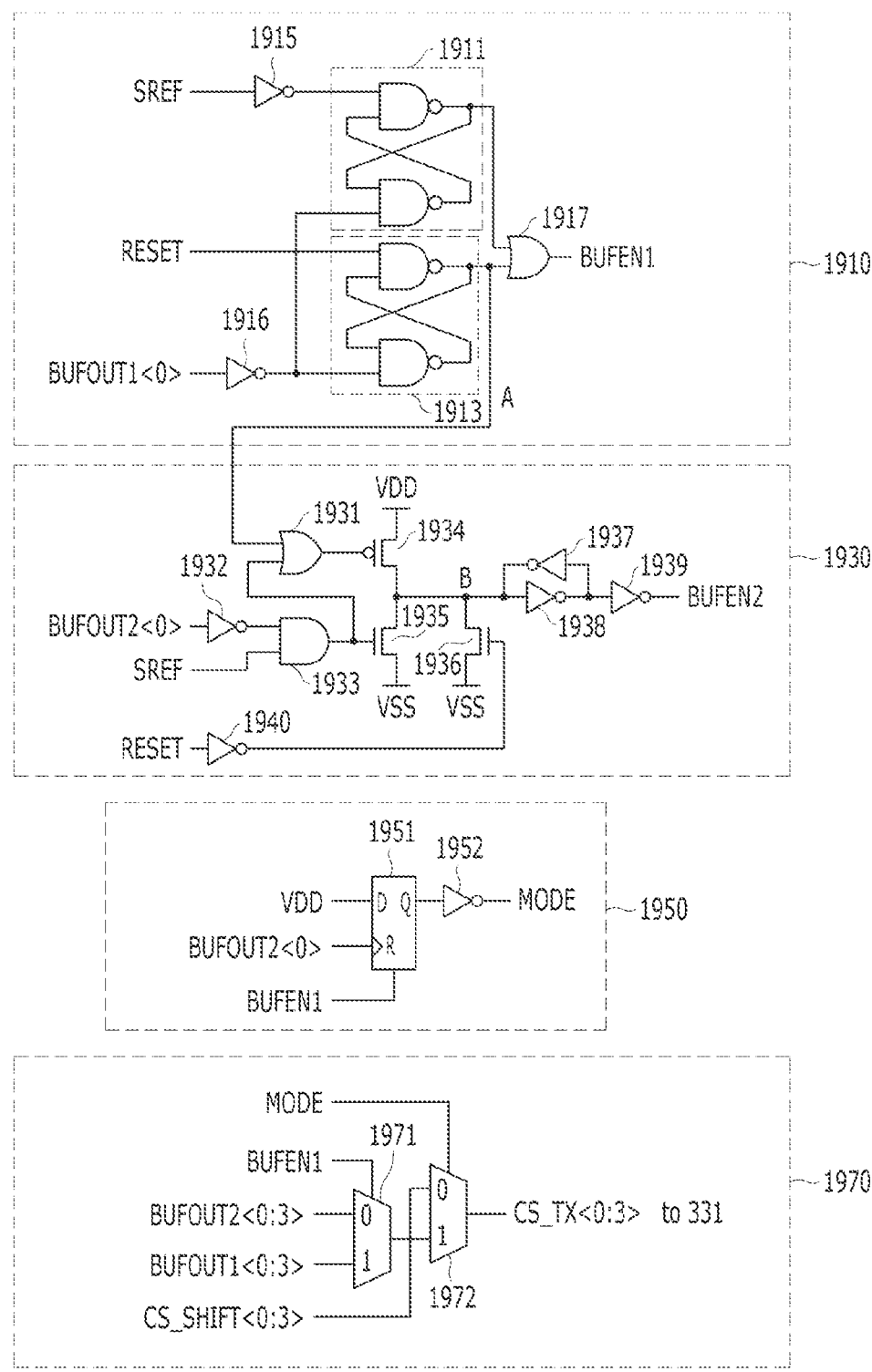
FIG. 19 is a configuration diagram of an embodiment of a chip select signal bypass control circuit in FIG. 18.

FIG. 19 is a configuration diagram of an embodiment of the chip select signal bypass control circuit 1840 in FIG. 18.

Referring to FIG. 19, the chip select signal bypass control circuit 1840 may include a first buffer activation signal generation circuit 1910, a second buffer activation signal generation circuit 1930, a mode signal generation circuit 1950, and a selection circuit 1970.

Signals of FIG. 19 will be first described. The reset signal RESET is a signal for a reset operation and may be a signal that is activated to a low level. A first buffer activation signal BUFEN1 is a signal for activating the CMOS-type buffers 1815, and when the first buffer activation signal BUFEN1 is activated to a high level, the CMOS-type buffers 1815 may be activated. The second buffer activation signal BUFEN2 is a signal for activating the comparator-type buffers 1813, and when the second buffer activation signal BUFEN2 is activated to a high level, the comparator-type buffers 1813 may be activated. A self-refresh signal SREF may be a signal that is activated to a high level in a self-refresh mode. First buffer output signals BUFOUT1<0:3> may be chip select signals received by the CMOS-type buffers 1815. Second buffer output signals BUFOUT2<0:3> may be chip select signals received by the comparator-type buffers 1813. Chip selection shift signals CS_SHIFT<0:3> may be chip select signals having passed through the control signal transmission circuit 350. A mode signal MODE may be a signal for distinguishing the asynchronous mode from the synchronous mode. When the mode signal MODE is at a high level, it may indicate the asynchronous mode, and when the mode signal MODE is at a low level, it may indicate the synchronous mode.

The first buffer activation signal generation circuit 1910 may include SR latches 1911 and 1913, inverters 1915 and 1916, and an OR gate 1917. The SR latch 1911 may activate the first buffer activation signal BUFEN1 to a high level when the self-refresh signal SREF is activated to a high level. The SR latch 1913 may activate the first buffer activation signal BUFEN1 to a high level when the reset signal RESET is activated to a low level. The SR latches 1911 and 1913 may deactivate the first buffer activation signal BUFEN1 to a low level when the first buffer output signal BUFOUT1<0>, which is one of the first buffer output signals BUFOUT1<0:3>, has a high level.

The second buffer activation signal generation circuit 1930 may include an OR gate 1931, inverters 1932, 1937, 1938, 1939, and 1940, an AND gate 1933, a PMOS transistor 1934, and NMOS transistors 1935 and 1936.

The PMOS transistor 1934 may drive a node B to a high level, and the NMOS transistors 1935 and 1936 may drive the node B to a low level. The inverters 1937 and 1938 to which input/output terminals are connected may maintain a voltage level of the node B, and the inverter 1939 may invert the output of the inverter 1938 to generate the second buffer activation signal BUFEN2. When the voltage level of the node B is a high level, the second buffer activation signal BUFEN2 may be activated to a high level, and when the voltage level of the node B is a low level, the second buffer activation signal BUFEN2 may be deactivated to a low level. The inverter 1932 and the AND gate 1933 may turn on the NMOS transistor 1935 when the second buffer output signal BUFOUT2<0>, which is one of the second buffer output signals BUFOUT2<0:3>, is at a low level and the self-refresh signal SREF is at a high level. The inverter 1940 may turn on the NMOS transistor 1936 when the reset signal RESET is activated to a low level. The OR gate 1931 may turn on the PMOS transistor 1934 when a signal of a node A and the output of the AND gate 1935 are at a low level.

The mode signal generation circuit 1950 may include a D flip-flop 1951 and an inverter 1952. The D flip-flop 1951 may receive the power supply voltage VDD through a terminal D thereof, receive the second buffer output signal BUFOUT2<0> through a clock terminal thereof, and receive the first buffer activation signal BUFEN1 through a reset terminal thereof. When the first buffer activation signal BUFEN1 is activated, a signal output to a terminal Q of the D flip-flop 1951 may be reset to a low level, and as a result, the mode signal MODE output from the inverter 1952 may have a high level. Then, at a rising edge of the second buffer output signal BUFOUT2<0>, a signal output to the terminal Q of the D flip-flop 1951 may transition to a high level, and as a result, the mode signal MODE output from the inverter 1952 may have a low level.

The selection circuit 1970 may include selectors 1971 and 1972. The selector 1971 may select and output the first buffer output signals BUFOUT1<0:3> when the first buffer activation signal BUFEN1 is activated at a high level, and select and output the second buffer output signals BUFOUT2<0:3> when the first buffer activation signal BUFEN1 is deactivated at a low level. The selector 1972 may select and output the output of the selector 1971 when the mode signal MODE is at a high level (in the case of the asynchronous mode), and select and output the chip selection shift signals CS_SHIFT<0:3> when the mode signal MODE is at a low level (in the case of the synchronous mode). The output CS_TX<0:3> of the selector 1972 may be transmitted to the memory chips 231 to 234 through the chip select signal transmission circuit 331.

Figure 20:
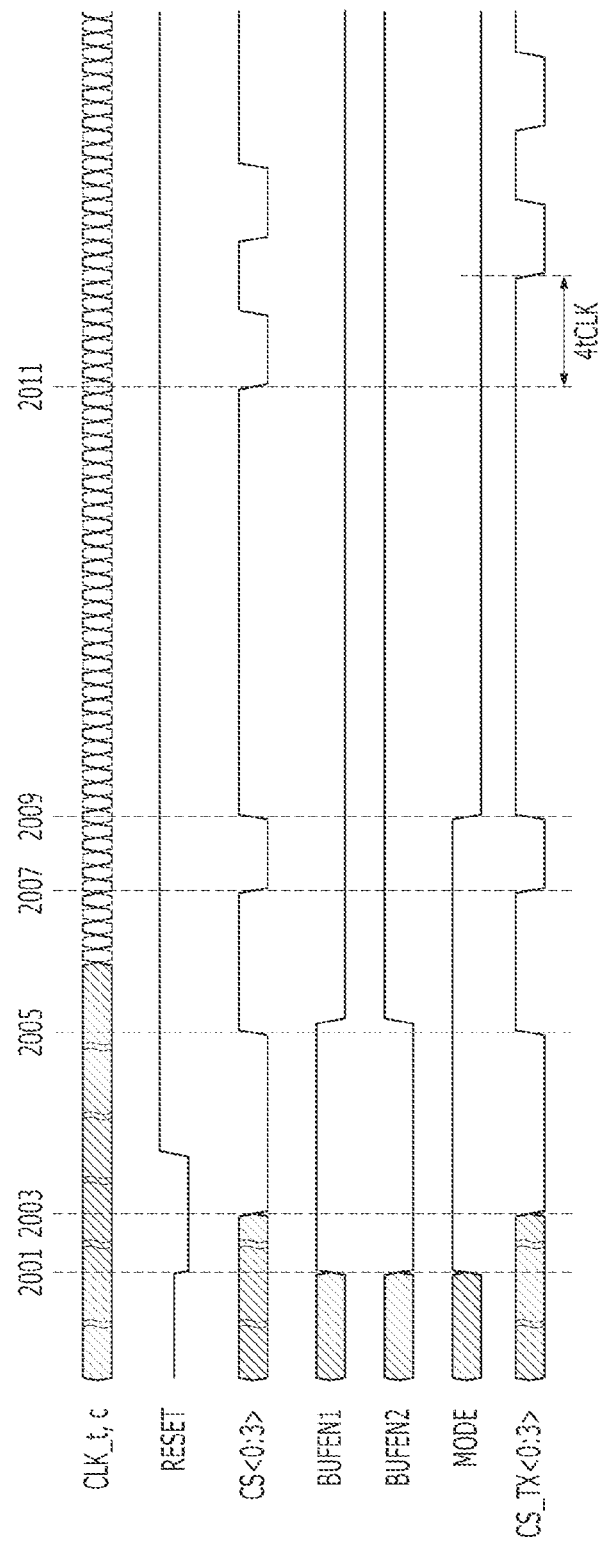
FIG. 20 is a timing diagram illustrating an example of an operation of the chip select signal bypass control circuit in FIG. 19.

FIG. 20 is a timing diagram illustrating an example of an operation of the chip select signal bypass control circuit 1840 in FIG. 19.

Referring to FIG. 20, at a time point 2001, the reset signal RESET may be activated to a low level. The first buffer activation signal generation circuit 1910 may activate the first buffer activation signal BUFEN1 to a high level in response to the activation of the reset signal RESET, so that the CMOS-type buffers 1815 may be activated. On the other hand, the second buffer activation signal generation circuit 1930 may deactivate the second buffer activation signal BUFFEN2 to a low level in response to the activated reset signal RESET, so that the comparator-type buffers 1813 may be deactivated. The mode signal generation circuit 1950 may generate the mode signal MODE at a high level in response to the activation of the first buffer activation signal BUFEN1. That is, the chip select signal bypass control circuit 1840 may operate in an asynchronous mode.

At a time point 2003, the chip select signals CS<0:3> may be activated to a low level, received by the CMOS-type buffers 1815 to become the first buffer output signals BUFOUT1<0:3>, and the first buffer output signals BUFOUT1<0:3> may be output as the output CS_TX<0:3> of the selection circuit 1970.

At a time point 2005, the chip select signals CS<0:3> may be deactivated at a high level, and the first buffer output signals BUFOUT1<0:3> may also be deactivated at a high level. In response to the first buffer output signal BUFOUT<0> that is deactivated to a high level, the first buffer activation signal generation circuit 1910 may deactivate the first buffer activation signal BUFEN1 to a low level and the second buffer activation signal generation circuit 1930 may activate the second buffer activation signal BUFEN2 to a high level.

At a time point 2007, the chip select signals CS<0:3> may be activated to a low level, and the second buffer output signals BUFOUT2<0:3> may also be activated to a low level.

At a time point 2009, the chip select signals CS<0:3> may be deactivated at a high level, and the second buffer output signals BUFOUT2<0:3> may be activated at a high level. In response to the second buffer output signal BUFOUT2<0> activated to a high level, the mode signal generation circuit 1950 may generate the mode signal MODE at a low level. Accordingly, the chip select signal bypass control circuit 1840 may operate in a synchronous mode.

At a time point 2011 that is the synchronization mode, the chip select signals CS<0:3> may be activated to a low level, and these signals may pass through the control signal transmission circuit 350 and then be output as the output CS_TX<0:3> of the selection circuit 1970. In the synchronous mode, it can be seen that a time difference of 4 clocks occurs between the chip select signals CS<0:3> and the output CS_TX<0:3> of the selection circuit 1970.

Referring to FIG. 20, it can be seen that in an asynchronous mode including a period in which the clocks CLK_t and CLK_c are deactivated, the chip select signals CS<0:3> are transmitted to the memory chips 231 to 234 by bypassing the control signal transmission circuit 350, and in a synchronous mode in which the clocks CLK_t and CLK_c are activated, the chip select signals CS<0:3> pass through the control signal transmission circuit 350 and then are transmitted to the memory chips 231 to 234. FIG. 20 illustrates an initialization operation, but the chip select signal bypass control circuit 1840 may operate in the same manner even during a self-refresh operation.

In an embodiment, the memory package 120 (FIG. 2) including the buffer chip 220 and the memory chips 231 to 234 may be tested during the manufacturing process or after the manufacturing in order to determine the presence or absence of a defect. When the memory package 120 is tested, in an embodiment, test equipment operates as the memory controller, and most of the test equipment operates at a low frequency. For example, when the test equipment operates at 1.6 GHz during a normal operation of the memory package 120, the test equipment may operate at a low speed such as 400 MHz during a test operation of the memory package 120. The control signal transmission circuit 350 of the buffer chip 220 delays the control signals by 4 clocks and transmits the delayed signals to the memory chips 231 to 234. In an embodiment, this might not be a burden in a normal operation in which the test equipment operates at a high speed, but may be a heavy burden that delays test time in a test operation in which the test equipment operates at a low speed.

Figure 21:
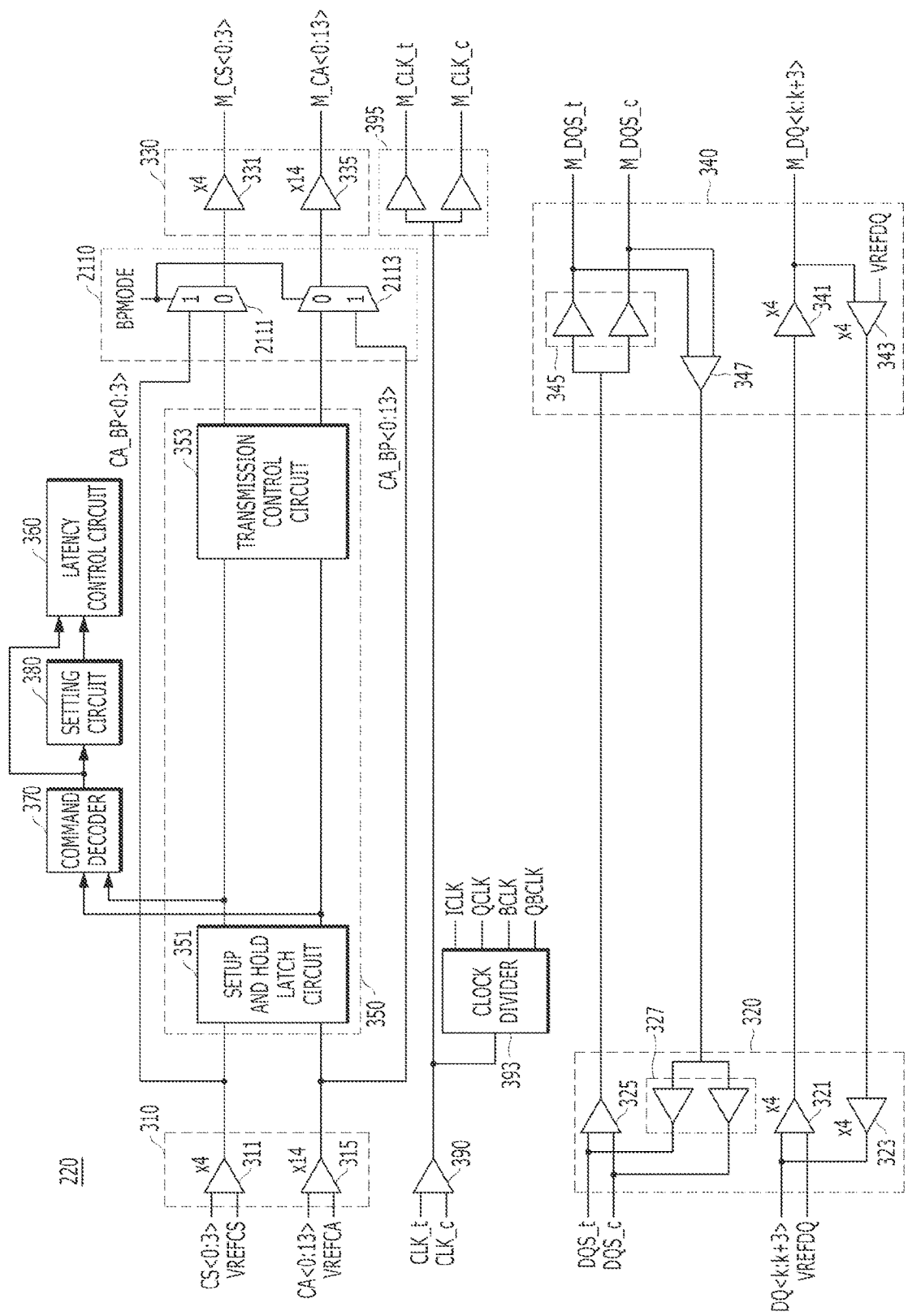
FIG. 21 is a configuration diagram of yet another embodiment of the buffer chip in FIG. 3.

FIG. 21 is a configuration diagram of yet another embodiment of the buffer chip 220 in FIG. 3. In FIG. 21, an embodiment in which in a bypass mode, the control signals CS<0:3> and CA<0:13> bypass the control signal transmission circuit 350 and are transmitted to the memory chips 231 to 234 without time delay will be described.

Referring to FIG. 21, the buffer chip 220 may include the external control signal interface 310, the external data interface 320, the internal control signal interface 330, the internal data interface 340, the control signal transmission circuit 350, the latency control circuit 360, the command decoder 370, the setting circuit 380, the clock reception circuit 390, the clock divider 393, the clock transmission circuit 395, and a bypass control circuit 2110.

When the bypass mode is set, the bypass control circuit 2110 may select control signals CS_BP<0:3> and CA_BP<0:13> received through the external control signal interface 310, that is, the control signals having bypassed the control signal transmission circuit 350, and transmit the selected control signals to the control signal transmission circuit 350. In a normal mode in which the bypass mode is not set, control signals transmitted from the control signal transmission circuit 350 may be selected and transmitted to the control signal transmission circuit 350.

The bypass control circuit 2110 may include selectors 2111 and 2113. When a bypass mode signal BPMODE is activated, the selector 2111 may select chip select signals CS_BP<0:3> received through the chip select signal reception circuit 311 and having bypassed the control signal transmission circuit 350 and transmit the selected chip select signals CS_BP<0:3> to the chip select signal transmission circuit 331. When the bypass mode signal BPMODE is deactivated, the selector 2111 may select chip select signals transmitted from the control signal transmission circuit 350 and transmit the selected chip select signals to the chip select signal transmission circuit 331.

When the bypass mode signal BPMODE is activated, the selector 2113 may select command address signals CA_BP<0:13> received through the command address reception circuit 315 and having bypassed the control signal transmission circuit 350 and transmit the selected signals to the command address transmission circuit 335. When the bypass mode signal BPMODE is deactivated, the selector 2113 may select command address signals transmitted from the control signal transmission circuit 350 and transmit the selected command address signals to the command address transmission circuit 335.

The bypass mode signal BPMODE is a signal that is activated when the bypass mode is set and may be generated by the setting circuit 380. In an embodiment, the bypass mode signal BPMODE may be mainly set during a test operation. In the bypass mode in which the bypass mode signal BPMODE is activated, in an embodiment, timing control of the control signals may be difficult because the control signal transmission circuit 350 is not used. However, during a test, in an embodiment, this might not be a problem because general low-frequency clocks CLK_t and CLK_c are used and a margin is sufficient.

In an embodiment, when the margin is sufficient such as in the test operation, time delay due to the control signal transmission circuit 350 may be reduced using the bypass mode, and as a result, operation time can be shortened.

Although embodiments according to the technical idea of the present disclosure have been described above with reference to the accompanying drawings, this is only for explaining the embodiments according to the concept of the present disclosure, and the present disclosure is not limited to the above embodiments. Various types of substitutions, modifications, and changes for the embodiments may be made by those skilled in the art, to which the present disclosure pertains, without departing from the technical idea of the present disclosure defined in the following claims, and it should be construed that these substitutions, modifications, and changes belong to the scope of the present disclosure.

What is claimed is:

1. A buffer chip comprising:
   a chip select signal reception circuit configured to receive chip select signals transmitted from a memory controller;
   a command address reception circuit configured to receive command address signals transmitted from the memory controller;
   a chip select signal transmission circuit configured to transmit the chip select signals to a plurality of memory chips;
   a command address transmission circuit configured to transmit the command address signals to the plurality of memory chips; and
   a command address fixing circuit configured to fix levels of at least one of the command address signals transmitted by the command address transmission circuit when the chip select signals are deactivated for a predetermined time or more.

2. The buffer chip of claim 1, further comprising:
   a control signal transmission circuit comprising a plurality of stages and configured to transmit the chip select signals received by the chip select signal reception circuit and the command address signals received by the command address reception circuit to the chip select signal transmission circuit and the command address transmission circuit, wherein, when the chip select signals in predetermined stages among the plurality of stages are all deactivated, the command address fixing circuit fixes levels of at least one of the command address signals transmitted by the control signal transmission circuit.

3. The buffer chip of claim 1, wherein the plurality of memory chips use pull-up termination for receiving signals transmitted from the command address transmission circuit, and the command address fixing circuit fixes the levels of at least one of the command address signals transmitted by the command address transmission circuit to a logic high level.

4. The buffer chip of claim 1, wherein the plurality of memory chips use pull-down termination for receiving signals transmitted from the command address transmission circuit, and the command address fixing circuit fixes the levels of at least one of the command address signals transmitted by the command address transmission circuit to a logic low level.

5. The buffer chip of claim 2, further comprising:

an external data interface configured to transmit and receive data to and from (to/from) the memory controller;

an internal data interface configured to transmit and receive the data to/from the plurality of memory chips;

a command decoder configured to decode the chip select signals received through the chip select signal reception circuit and the command address signals received through the command address reception circuit;

a latency control circuit configured to control activation and deactivation of the external data interface and the internal data interface during a write operation and a read operation;

a setting circuit configured to perform a setting operation according to a decoding result of the command decoder;

a clock reception circuit configured to receive a clock from the memory controller; and a clock transmission circuit configured to transmit the clock received by the clock reception circuit to the plurality of memory chips.

6. A semiconductor package comprising:

a package substrate comprising a plurality of terminals configured to communicate with a memory controller and a plurality of bonding pads configured to communicate inside a package;

a buffer chip disposed on the package substrate;

a plurality of memory chips stacked on the buffer chip; and a plurality of wires connecting the plurality of bonding pads and the plurality of memory chips, wherein the buffer chip is configured to communicate with the memory controller through the plurality of terminals of the package substrate, the plurality of memory chips are configured to communicate with the buffer chip through the plurality of wires and the plurality of bonding pads of the package substrate, and the buffer chip comprises:

a chip select signal reception circuit configured to receive chip select signals transmitted from the memory controller;

a command address reception circuit configured to receive command address signals transmitted from the memory controller;

a chip select signal transmission circuit configured to transmit the chip select signals to the plurality of memory chips;

a command address transmission circuit configured to transmit the command address signals to the plurality of memory chips; and a command address fixing circuit configured to fix levels of at least one of the command address signals transmitted by the command address transmission circuit when the chip select signals are deactivated for a predetermined period of time or more.

7. The semiconductor package of claim 6, wherein the buffer chip further comprises:

a control signal transmission circuit comprising a plurality of stages and configured to transmit the chip select signals received by the chip select signal reception circuit and the command address signals received by the command address reception circuit to the chip select signal transmission circuit and the command address transmission circuit, wherein, when the chip select signals in predetermined stages among the plurality of stages are all deactivated, the command address fixing circuit fixes levels of at least one of the command address signals transmitted by the control signal transmission circuit.

8. The semiconductor package of claim 6, wherein the plurality of memory chips use pull-up termination for receiving signals transmitted from the command address transmission circuit, and the command address fixing circuit fixes the levels of at least one of the command address signals transmitted by the command address transmission circuit to a logic high level.

9. The semiconductor package of claim 6, wherein the plurality of memory chips use pull-down termination for receiving signals transmitted from the command address transmission circuit, and the command address fixing circuit fixes the levels of at least one of the command address signals transmitted by the command address transmission circuit to a logic low level.

10. A buffer chip comprising:

a chip select signal reception circuit configured to receive chip select signals transmitted from a memory controller;

a command address reception circuit configured to receive command address signals transmitted from the memory controller;

a chip select signal transmission circuit configured to transmit the chip select signals to a plurality of memory chips;

a command address transmission circuit configured to transmit the command address signals to the plurality of memory chips; and a command address fixing circuit configured to fix levels of at least one of the command address signals transmitted by the command address transmission circuit in response the chip select signals.

11. The buffer chip of claim 10, wherein the command address fixing circuit monitors the chip select signals, and fixes levels of at least one of the command address signals transmitted by the command address transmission circuit when the plurality of memory chips don't need to decode the command address signals.

12. The buffer chip of claim 10, wherein the plurality of memory chips use pull-up termination for receiving signals transmitted from the command address transmission circuit, and the command address fixing circuit fixes the levels of at least one of the command address signals transmitted by the command address transmission circuit to a logic high level.

13. The buffer chip of claim 10, wherein the plurality of memory chips use pull-down termination for receiving signals transmitted from the command address transmission circuit, and the command address fixing circuit fixes the levels of at least one of the command address signals transmitted by the command address transmission circuit to a logic low level.

* * * * *